(12) United States Patent
Mashikian et al.

(10) Patent No.: US 9,711,276 B2
(45) Date of Patent: Jul. 18, 2017

(54) RESONANT TRANSFORMER

(71) Applicant: Instrument Manufacturing Company, Mancheters, CT (US)

(72) Inventors: Matthew S. Mashikian, Pomfret Center, CT (US); Andrzej Pawel Szatkowski, Bolton, CT (US)

(73) Assignee: Instrument Manufacturing Company, Manchester, CT (US)

( * ) Notice: Subject to any disclaimer, the term of this patent is extended or adjusted under 35 U.S.C. 154(b) by 72 days.

(21) Appl. No.: 14/505,872

(22) Filed: Oct. 3, 2014

(65) Prior Publication Data
US 2016/0099103 A1    Apr. 7, 2016

(51) Int. Cl.
| | | |
|---|---|---|
| H01F 27/02 | (2006.01) | |
| H01F 17/06 | (2006.01) | |
| H01F 29/00 | (2006.01) | |
| H01F 27/24 | (2006.01) | |
| H01F 27/28 | (2006.01) | |
| H01F 29/10 | (2006.01) | |
| G01R 31/02 | (2006.01) | |
| G01R 31/12 | (2006.01) | |

(52) U.S. Cl.
CPC ............. *H01F 29/00* (2013.01); *H01F 27/24* (2013.01); *H01F 27/28* (2013.01); *H01F 29/10* (2013.01); *G01R 31/027* (2013.01); *G01R 31/1254* (2013.01)

(58) Field of Classification Search
CPC .................................. H01F 5/00; H01F 27/28
USPC ..................... 336/90, 92, 94, 96, 98, 178
See application file for complete search history.

(56) References Cited

U.S. PATENT DOCUMENTS

| | | | | |
|---|---|---|---|---|
| 1,671,492 A | * | 5/1928 | Skinner | H01F 27/14 |
| | | | | 174/11 R |
| 2,674,721 A | * | 4/1954 | Jackson | H04N 3/223 |
| | | | | 336/134 |
| 2,708,933 A | | 5/1955 | August | |
| 3,049,919 A | | 8/1962 | Roth | |

(Continued)

FOREIGN PATENT DOCUMENTS

| | | | | |
|---|---|---|---|---|
| CN | 201360179 | | 12/2008 | |
| DE | GB 2325567 A | * | 11/1998 | ........... H01F 7/1646 |

OTHER PUBLICATIONS

PCT International Search Report for PCT/US2015/053203 dated Jan. 4, 2016.
PCT/US2015/053203, Sep. 30, 2015.

*Primary Examiner* — Tsz Chan
(74) *Attorney, Agent, or Firm* — McCarter & English, LLP

(57) ABSTRACT

Exemplary embodiments of the present disclosure are directed to resonant transformers (or reactors) and coil arrangements associated with resonant transformers. The coil arrangements can include a grounding coil configured to generate a net-zero induced voltage between a first end of the grounding coil and a second end of the grounding coil layer, and one or more step-up coil layers formed by one or more layers of pressure tape, insulating materials, and wire wrapped to form coils about a portions of a split magnetic core. The split magnetic core can include a first core segment and a second core segment, where one of the core segments is disposed within a main housing and one of the core segments is disposed external to the main housing. A gap between the first and second core segments can be manipulated to control an inductance of the resonant transformer.

28 Claims, 11 Drawing Sheets

(56) References Cited

U.S. PATENT DOCUMENTS

| | | | |
|---|---|---|---|
| 3,184,651 A * | 5/1965 | Albosta | H01F 7/14 335/183 |
| 3,253,215 A * | 5/1966 | Moakler | G01R 19/15 324/127 |
| 4,155,340 A * | 5/1979 | Fernquist | F02P 5/1555 123/617 |
| 4,305,056 A | 12/1981 | Mochida et al. | |
| 6,064,192 A * | 5/2000 | Redmyer | G01R 15/186 324/117 H |
| 6,211,766 B1 | 4/2001 | Goseberg et al. | |
| 7,009,854 B2 | 3/2006 | Fushimi | |
| 7,541,908 B2 | 6/2009 | Kitahara et al. | |
| 8,587,399 B2 | 11/2013 | Crutcher et al. | |
| 2002/0157622 A1* | 10/2002 | Meintschel | F01L 9/04 123/90.11 |
| 2010/0033284 A1 | 2/2010 | Yamakami et al. | |
| 2011/0234351 A1* | 9/2011 | Kawarai | H01F 21/06 336/30 |
| 2013/0200971 A1* | 8/2013 | Crutcher | H01F 27/24 336/90 |
| 2014/0049351 A1 | 2/2014 | Carsten | |

* cited by examiner

RESONANT TRANSFORMER

TECHNICAL FIELD

Exemplary embodiments of the present disclosure are directed to transformers, and more particularly, to resonant transformers and coil arrangements associated therewith.

BACKGROUND

Installed electrical power equipment is often subjected to diagnostic tests, such as partial discharge tests, requiring high alternating voltage at power frequency. Regular power frequency voltage sources conventionally used in factories for high voltage tests typically include relatively heavy and bulky transformers that are not practical for use in the field where installed equipment needs to be tested. Fortunately, when the electrical equipment to be tested can be considered as an electrical capacitor, as is the case for an electrical power cable, it is possible to generate a desired test voltage using a resonant transformer (also referred to herein as "reactor"), which is often significantly smaller and lighter than a regular transformer of the same rating, and can be transportable to sites outside the factory. If L is the inductance of the resonant transformer, C is the capacitance of the cable to be tested, and f is the frequency of a voltage source input to the resonant transformer, resonance is said to be achieved when $2\pi fL=1/(2\pi fC)$. Under resonance conditions, the voltage across the test cable becomes a large multiple, Q, of that of the alternating voltage source, where Q is referred to as the quality of the circuit. Thus, starting with a modest voltage magnitude (e.g., ~1 kV), it is possible to generate a high voltage (e.g., ~25 kV to ~75 kV).

The capacitance of a given type of cable to be tested varies proportionally with the length of the cable. That is, as the length of a given cable type increases, the capacitance of the cable increases proportionally. In order to achieve resonance for different length cables, either inductance L or frequency f or both have to be adjusted accordingly. In some conventional systems, the resonant transformer can be configured to generate a variable inductance L to achieve a desired inductance value for a given capacitance to be tested.

To achieve a variable inductance resonant transformer, a high voltage winding, sometimes split over two coils, is built around one or two legs of a magnetic core that is split to form two U-shaped magnetic paths facing each other across open air gaps. While one of these U-shaped cores is stationary, the other is connected to mechanical actuators which allow the gap to open or close. The entire assembly, including the mechanical actuators, are generally housed in a relatively large metal tank, normally filled with insulating oil to provide dielectric stability to the coil of the resonant transformer (e.g., to inhibit undesirable discharges in the coil). The forces of electromagnetic origin on the faces of the core across air gaps tend to dictate mechanical and structural designs which result in heavy core assemblies. When testing objects of small capacitance, such as short cables, with commercially available variable inductance transformers, resonance is often not achievable and complex schemes have to be developed to accommodate small capacitance. For example, in one conventional scheme, the resonant transformer can be connected in parallel with the cable, while allowing the resonant transformer to function as an auto-transformer. Furthermore, with cables of large capacitance, the air gap is often forced to assume large values (e.g., approximately 15 cm or more). As a result, the tank housing of the resonant transformer typically must be much larger (and heavier) than desired to accommodate movement of the split magnetic core. Another major contribution to the weight of such transformers is the insulating oil used in the tank.

SUMMARY

To overcome the problems associated with conventional resonant transformers (or reactors), exemplary embodiments of the present disclosure advantageously provide for resonant transformers that have a substantial weight and volume reduction as compared to conventional resonant transformers, resulting in smaller and more fuel-efficient test vehicles for transporting the resonant transformers to perform field testing of cables, while achieving a wide range of inductances that can allow users to avoid complicated schemes when testing short cables having relatively low capacitance. Exemplary embodiments can be safely and effectively operated without using heavy and environmentally unfriendly insulating oil to facilitate dielectric stability in the coil of the resonant transformer.

Exemplary embodiments of the present disclosure provide for resonant transformers (or reactors) including a magnetic core having a first core segment and a second core segment that can form a gap that is devoid of magnetic material, where a size of the gap can control an inductance of the resonant transformer. Exemplary coil arrangements of the resonant transformers are described herein to provide for stable operation of the resonant transformers (e.g., at tens or hundreds of kilovolts) when exposed to the atmosphere by using a coil arrangement having a grounding coil layer that is wound to generate a net zero induced voltage between the ends of the grounding coil and sequentially stepped or graded step-up coil layers including pressure tape (such as mylar tape) and insulating material (such as ethylene-propylene rubber (EPR) tape). The coil arrangements can include one or more taps to allow the resonant transformer to output intermediate voltages in addition to the voltages that can be output by the end of the wire that forms the step-up coils.

In accordance with some embodiments of the present disclosure, at least a portion of the resonant transformer including the coils can be disposed in a sealed main housing that is maintained at atmospheric pressure or a relatively low pressure nitrogen gas, while portions of the resonant transformer, such as a portion of the magnetic core can be positioned external to the housing. By positioning one of the core segments externally to the housing, exemplary embodiments of the present disclosure can further reduce the size and weight of embodiments of the resonant transformers described herein as compared to convention resonant transformers.

When embodiments of the coil arrangements described herein are utilized in the resonant transformer, the housing can be filled with air (at a low humidity) or an inert gas, such as nitrogen, as opposed to an insulating oil, due to the reduced likelihood of undesirable electrical discharges from the coil arrangements. By using a housing that is filled with air or an inert gas at a relatively low pressure, the weight of exemplary embodiments of the resonant transformers described herein can be substantially reduced as compared to conventional resonant transformers housed in a tank filled with an insulating oil. For example, exemplary embodiments of the present disclosure can weigh at least thirty-five (35) percent less than conventional resonant transformers housed in a tank filled with an insulating oil.

For embodiments of the resonant transformers that utilize multiple coils (e.g., two coils), the coils can be used independently of each other, electrically connected in parallel, or electrically connected in series with each other. To form a resonant circuit, the resonant transformer is electrically coupled, in series, with a capacitive load. That is, whether an output of the resonant transformer is generated by a single coil, both coils operating in parallel with each other, or both coils operating in series with each other, the output of the resonant transformer is electrically coupled in series to a capacitive load. As one example, when the two coils are configured in parallel with one another, both of the coils can be operatively coupled to a capacitive load such that the parallel configuration of coils are electrically connected in series with the capacitive load. As another example, when two coils are connected in series one of the coils can receive an input voltage and can output an intermediate voltage to the input of the second coil, and an output of the second coil can be operatively coupled to a capacitive load such that the coils and the capacitive load are in series with each other. The use of a single coil, two coils in parallel, and/or two coils in series can facilitate a wide range of inductances of the resonant transformers described herein, and a wide range of output voltages and output currents from the resonant transformers.

In accordance with embodiments of the present disclosure, a transformer is disclosed that includes a main housing, a split magnetic core, and a coil. The split magnetic core has a first core segment and a second core segment. The first core segment is disposed within the main housing and the second core segment can be disposed external to the main housing. At least one coil is wrapped around the first core segment. A gap between the first and second core segments is manipulated to adjust an inductance of the split magnetic core. The housing can be filled with a dry air or an inert gas (e.g., nitrogen) that is maintained under modest pressure and the second core segment can be exposed to atmospheric pressure. The first core segment can have at least one of a U-shaped configuration or a C-shaped configuration, and the second core segment can have an I-shaped configuration.

In accordance with embodiments of the present disclosure, the second core segment can be moveable with respect to the first core segment. For example, exemplary embodiments can include an actuator that is operative to move the second core segment with respect to the first. A non-magnetic member, such as a solid insulating insert or an inflatable member, can be configured to be disposed between the second core segment and the first core segment to limit a movement of the second core segment towards the first core segment during an operation of the transformer as well as to limit mechanical vibrations of the second core segment. A resilient member can be configured to urge the second core segment towards the first core segment such that the second core segment can be held in compression with the non-magnetic member.

In accordance with embodiments of the present disclosure, a distance between the second core segment can be fixed with respect to the first core segment to define a maximum gap size. An actuator can be operatively coupled to a magnetic insert member, and the actuator can be configured to move the magnetic insert member with respect to the first and second core segments to position the magnetic insert member in the gap between the first and second core segments to adjust the size of the gap and the inductance of the transformer.

In accordance with embodiments of the present disclosure, the first core segment can be permanently connected to (or integrally formed with) the second core segment, and both core segments can be located within the main housing. A slice of magnetic material can be removed from the second core segment, forming a notch in the second core segment that is devoid of magnetic material to define a maximum size of the gap. The housing can conform to the notch to follow a contour of the notch to form a recess in the housing extending into the notch. The size of the gap can be modified by inserting in the notch, from outside of the housing, an insert formed of a magnetic material of variable thickness and a non-magnetic material, which may include an inflatable material. The insert can be received in the recess to completely and snugly fill the recess and the notch to reduce the size of the gap. An actuator can be configured to move the insert into and out of the recess (and the notch) to adjust the inductance of the resonant transformer. In some embodiments, the insert can be disposed within the housing and can be moved into and out of the notch by the actuator.

A coil arrangement about the core can include a grounding coil layer and at least one step-up coil layer. The grounding coil layer can be formed by a ground wire that is wrapped about a core mandrel surrounding a portion of the first core segment in more than one direction. For example, the grounding coil can include a first number of turns in a first direction and the same number of turns in a second direction opposite the first direction. The grounding coil layer can be surrounded by a layer of insulating material. The at least one step-up coil can include a course of step-up wire wrapped generally circumferentially about the layer of insulating material, wherein the course of the step-up wire in the step-up coil layer can be sandwiched between coaxially extending layers of insulating pressure tape. A layer of insulating material is disposed generally circumferentially over an outer layer of the pressure tape.

Further step-up coil layers can be disposed coaxially and concentrically over preceding step-up coils, and can include a further course of the step-up wire, a further layer of pressure tape disposed coaxially and concentrically over each further course of the step-up wire, a further layer of insulating material disposed coaxially and concentrically over each further layer of pressure tape, and a still further layer of pressure tape disposed coaxially and concentrically over each further layer of insulating material.

In accordance with embodiments of the present disclosure, a coil arrangement for a transformer is disclosed. The coil arrangement includes a grounding coil wound coaxially and concentrically over a non-metallic mandrel that covers the core. The mandrel can have a cross-section that generally corresponds to a shape of a cross-section of the core, but the mandrel can have rounded, smooth corners. The grounding coil is wound in alternating directions along a portion of the magnetic core to generate an induced net voltage between a first end of the grounding coil and a second end of the grounding coil that is substantially zero. In some embodiments, the grounding coil can be wound a first number of turns in a first generally circumferential direction (e.g., clockwise) about the magnetic core and wound a second number of turns in a second generally circumferential direction (e.g., counterclockwise) about the magnetic core. In some embodiments, the first number of turns can be disposed adjacent to the second number of turns, and the first number of turns equals the second number of turns. In some embodiments, the coil arrangement can include several layers of insulating material disposed coaxially and concentrically over the grounding coil about a portion of a magnetic core of the transformer and can be sandwiched between layers of pressure tape.

Any combination or permutation of embodiments is envisioned. Other objects and features will become apparent from the following detailed description considered in conjunction with the accompanying drawings. It is to be understood, however, that the drawings are designed as an illustration only and not as a definition of the limits of the invention.

DETAILED DESCRIPTION

Figure 1A:
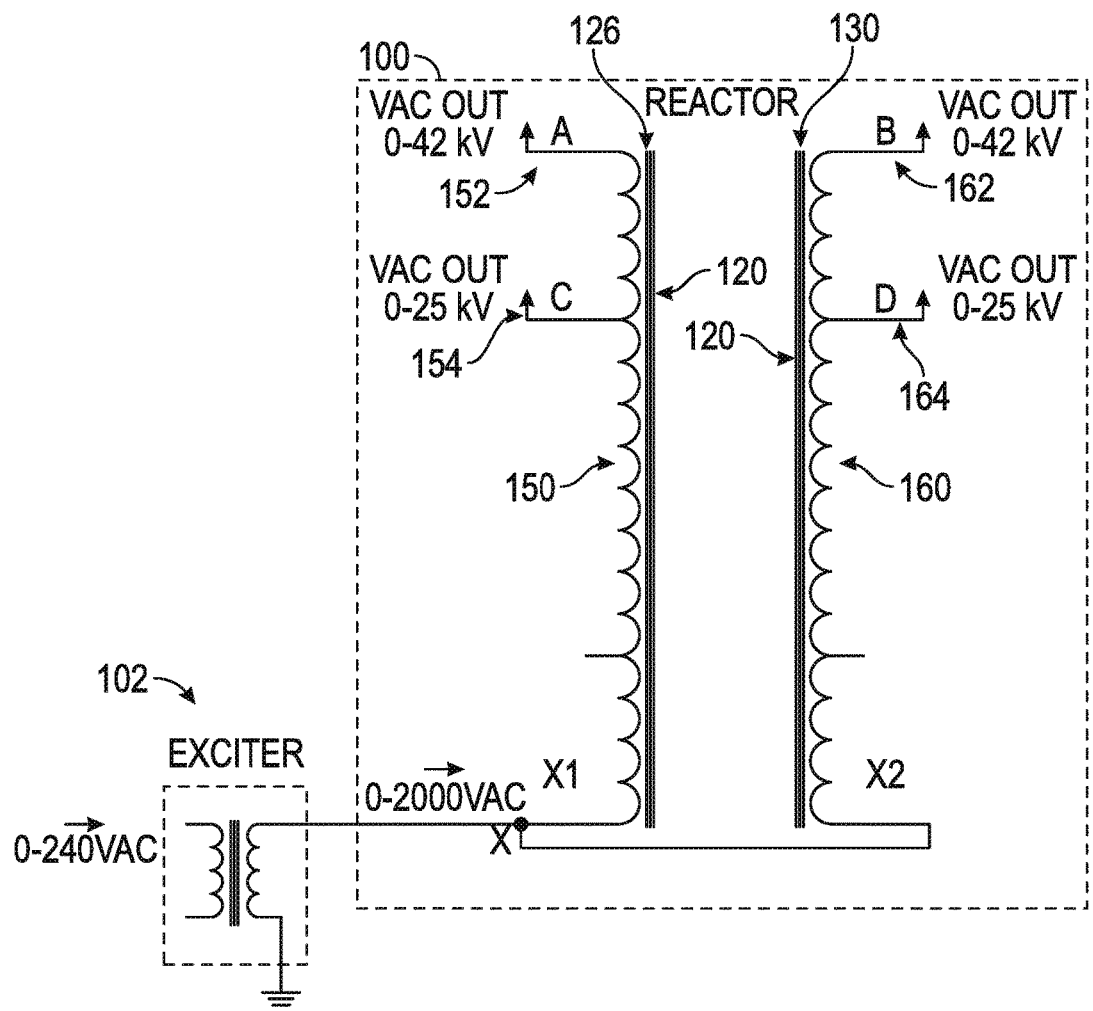
FIG. 1A is a schematic diagram of a resonant transformer having multiple coils and taps in accordance with exemplary embodiments of the present disclosure.

Exemplary embodiments of the present disclosure are related to resonant transformers (or reactors) including a magnetic core having a first core segment and a second core segment that can define a gap, where a size of the gap can control an inductance of the resonant transformer. The gap can be manipulated to control the inductance by moving the second core segment towards or away from the first core segment and/or by maintaining a distance between the first core segment and the second core segment and introducing a magnetic insert member into the gap to reduce the size of the gap.

According to exemplary embodiments, the resonant transformers can have a U/I magnetic core arrangement (i.e. a magnetic core having a U-shaped segment and an I-shaped segment). One or more coil arrangements can be formed over one or both legs of the U-shaped portion of the magnetic core. Because the magnetic core can have a generally rectangular cross-section with generally sharp edges, a non-metallic, non-magnetic core mandrel that has a cross-sectional shape that generally coincides with the cross-sectional shape of the magnetic core, but which has generally rounded, smooth edges, can cover the legs of the U-shaped segment of the magnetic core. The coil arrangements can be wrapped over the core mandrel. In some embodiments, the I-shaped segment of the core can be moveable with respect to the U-shaped segment of the core to adjust a gap between the U-shaped segment and the I-shaped segment to vary the inductance of the resonant transformers. While exemplary embodiments are described as having a U-shaped segment, those skilled in the art will recognize that other geometries may be used to form the magnetic core. For example, in exemplary embodiments, a C-shaped core may be used instead of a U-shaped core.

The coil arrangement(s) can provide for stable operation of the resonant transformers described herein (e.g., at tens or hundreds of kilovolts) without a protective housing and without requiring the use of insulating oils that are commonly required for the operation of conventional resonant transformers to prevent undesirable and dangerous electrical discharges between the step-up or build-up coils and ground. Thus, exemplary embodiments of the present disclosure can be stably operated when exposed to the atmosphere at atmospheric pressure and operating at voltages upwards of tens or hundreds of kilovolts. As a precaution, in exemplary embodiments of the present disclosure, at least the U-shaped segment of the magnetic core and the coil arrangements can be disposed in a sealed main housing that is maintained at atmospheric pressure or at a relatively low pressure inert gas, such as nitrogen. By positioning one of the core segments externally to the housing, exemplary embodiments of the present disclosure can further reduce the size and weight of embodiments of the resonant transformers described herein as compared to convention resonant transformers. The housing can be filled with air (at a low humidity) or an inert gas, such as nitrogen. Filling the housing with air or an inert gas at a relatively low pressure, as opposed to an insulating oil, allows a weight of exemplary embodiments of the resonant transformers described herein to be substantially reduced as compared to conventional resonant transformers housed in a tank filled with an insulating oil. Exemplary embodiments of the present disclosure can weigh approximately thirty-five (35) to approximately sixty-five (65) percent less than conventional resonant transformers housed in a tank filled with an insulating oil. For example, an exemplary embodiment of the resonant transformer including two coils can weigh approximately 1,100 to approximately 1,200 pounds, while a conventional resonant transformer can weigh over 3,000 pounds.

In exemplary embodiments, a structure of the coil arrangements described herein can include a grounding coil layer and one or more step-up coil layers that are configured to reduce the likelihood of undesirable electrical discharges as compared to conventional resonant transformers. The coil arrangements can include as many step-up coil layers as necessary to achieve a total number of turns required to output a desired voltage from the resonant transformer. For example, in an exemplary operation, the resonant transformers can be used to test electrical cables at various operating voltages, the number of step-up coils (and total number of turns associated with the step-up coils) can be specified to meet a voltage rating of the resonant transformer to operate at the various operating voltages. The grounding coil can be wound over the core mandrel for a specified number of turns in alternating directions to generate a net induced voltage of zero between a first end of the grounding coil and a second end of the grounding coil.

The step-up coil layers can be wrapped in successive layers coaxially and concentrically over the grounding coil layer, and each successively wrapped step-up layer can have fewer turns than preceding step-up layers (e.g., two or four fewer turns for each successive step-up layer). Using this approach, the step-up coil layers can have a stepped or graded configuration defining a sloping profile along the ends of the coil arrangement. In exemplary embodiments, an insulating material can be disposed between the grounding coil and the step-up coil layer, and between successive step-up coil layers to electrically insulate the grounding coil and step-up coils from each other, and the step-up coils can be sandwiched between layers of insulating pressure tape.

For embodiments of the resonant transformers that utilize multiple coils (e.g., two coils), the coils can be electrically connected in parallel or series with each other. As one example, when the two coils are configured in parallel with one another, one or both of the coils can be operatively coupled to a load. As another example, when two coils are connected in series, one of the coils can receive an input voltage and can output an intermediate voltage to the input of the second coil, and an output of the second coil can be operatively coupled to a load.

In some embodiments, each of the coils can include one or more taps at different location on the coil to allow the user of the resonant transformer to obtain different output voltages and inductance values from the resonant transformer in response to the same input voltage. A number of turns between the input to the coil and the tap locations can determine a voltage output at a given tap as well as an inductance associated with the coil.

Figure 1B:
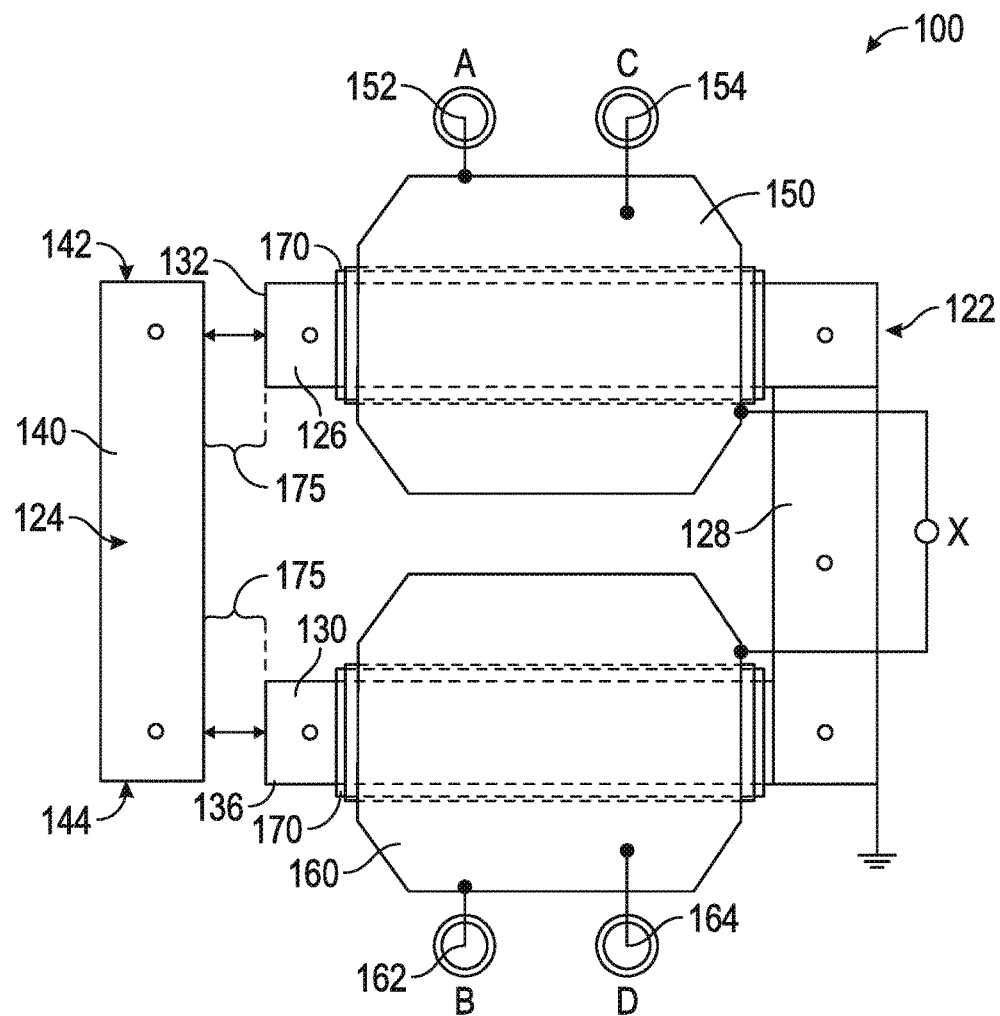
FIG. 1B is a schematic diagram illustrating an exemplary geometry and structure of the resonant transformer of FIG. 1A in accordance with exemplary embodiments of the present disclosure.

Referring now to FIGS. 1A and 1B, an exemplary resonant transformer 100, in accordance with exemplary embodiments of the present disclosure, can include a magnetic core 120 having a first leg 126 and a second leg 130, and conductor coils or windings 150 and 160, which can be disposed, wound, or wrapped about the first and second legs 126 and 130 of the core 120. In an exemplary operation, the core 120 can be electrically coupled to ground. In exemplary embodiments, a core mandrel 170, shown in FIG. 1B, can surround the first and second legs 126 and 130 and the coils 150 and 160 can be wound over at least the core mandrel 170 such that the core mandrel 170 is disposed between the core and the coils 150 and 160. The resonant transformer 100 can be configured to have an adjustable inductance and to output high voltages (e.g., kilovolts, tens of kilovolts, hundreds of kilovolts) in response to an input voltage (e.g., an input voltage received by an exciter 102). In exemplary embodiments, the coils 150 and 160 can include as many turns as necessary to achieve a desired voltage at an output of the resonant transformer 100. In some embodiments, the coils 150 and 160 can be electrically coupled to each other in parallel or series as described herein.

As shown in FIGS. 1A and 1B, the coil 150 can include taps 152 and 154, and the coil 160 can include taps 162 and 164. While coils 150 and 160 have been illustrated as each including two taps, those skilled in the art will recognize that the coils 150 and 160 can include more or fewer taps. Each of the taps 152 and 154 can be electrically coupled to the coil 150 at different locations on the coil 150, and each of the taps 162 and 164 can be electrically coupled to the coil 160 at different locations on the coil 160. The different tap locations correspond to a different number of turns in the coil such that the resonant transformer 100 can be configured to output different voltages at each tap in response to the same input voltage. Because the tap locations correspond to a different number of turns in the coils 150 and 160, an inductance of the resonant transformer 100 associated with each of the tap locations on the coils can be different.

The coils 150 and 160 can be electrically coupled to each other in parallel (as illustrated by node "X") such that each of the coils 150 and 160 can receive the same input voltage and can generate separate output voltages in response to the input voltage. In exemplary embodiments, the coils 150 and 160 can be formed to be substantially similar or identical (e.g., can each include the same number of turns using the same type of wire), and the taps 152 and 162 can correspond to substantially identical tap locations on the coils 150 and 160 such that when the taps 152 and 162 are used (for parallel coils 150 and 160), the coils 150 and 160 can be configured to have substantially identical inductances and to output substantially identical voltages in response to the same input voltage. Likewise, the taps 154 and 164 can correspond to substantially identical tap locations on the coils 150 and 160 such that when the taps 154 and 164 are used (for parallel coils 150 and 160), the coils 150 and 160 can be configured to have substantially identical inductances and to output substantially identical voltages in response to the same input voltage.

In exemplary embodiments, when the coils 150 and 160 are connected in parallel, either of the coil 150 or 160, or both of the coils 150 and 160, can be operatively coupled to a load (e.g., a capacitive load) in a resonant circuit. As one example, the tap 152 of the coil 150 can be operatively coupled to the load, and the remaining taps can be electrically isolated from the load. In this configuration, the output voltage of the resonant circuit 100 is determined based on the input voltage to the coil 150 and the number of turns in the coil 150 up to the tap 152. As described herein, when only the coil 150 is operatively coupled to the load, the inductance of the resonant transformer 100 can be determined based on the number of turns in the coil up to the tap 152 and based on a controllable gap in the core 120 of the resonant transformer 100. As another example, the taps 152 and 162 can be operatively coupled to the load in parallel, and the remaining taps can be electrically isolated from the load. In this configuration, as described herein, the output voltage at the taps 152 and 162 can be substantially identical (e.g., where coils 150 and 160 are substantially identical and the taps 152 and 162 are positioned at corresponding tap locations). As described herein, when both of the taps 152 and 162 of coils 150 and 160, respectively, are operatively coupled to the load in parallel, the inductance of the resonant transformer 100 can be determined based on the number of turns in the coil 150 up to the tap 152, the number of turns in the coil 160 up to the tap 162, and a controllable gap in the core 120 of the resonant transformer 100. For example, where the coils 150 and 160 are substantially identical, and the taps 152 and 162 are positioned at corresponding tap locations, the inductance of the resonant transformer 100 when only the tap 152 is used can generally be twice the inductance of the resonant transformer 100 when the taps 152 and 162 are used in parallel and the gap in the core is the same. Using the coils 150 and 160 in parallel can allow the resonant transformer to operate at higher current ratings than using a single coil because the output current is divide over the two coils.

In some embodiments, the resonant transformer 100 can be configured to electrically couple the coils 150 and 160 in series such that the output from the coil 150 forms the input to the coil 160. In this configuration, where coils 150 and 160 are substantially identical, the output voltage of the resonant transformer can be as much as or more than twice the output voltage of the coils 150 and 160 when used singly or connected in parallel, and the inductance of the resonant transformer 100 can be as much as or more than twice the output voltage of the coils 150 and 160 when used singly or connected in parallel. In some embodiments, the resonant transformer 100 can be reconfigurable to switch between a parallel and series arrangement of the coils 150 and 160. To connect the coils 150 and 160 in series, the input to the coil can be connect to node "X1" and node "A" can be connected to node "X2" such that an output of the coil 150 forms the input to coil 160.

Referring to FIG. 1B, the core 120 of the resonant transform can have a U/I configuration. The legs 126 and 130 can be formed by a (U-shaped) core segment 122 and can be positioned generally parallel to one another. The legs 126 and 130 can be coupled to each other at one end by a magnetic member 128, while the other terminal ends 132 and 136 of the legs 126 and 130, respectively, are separated or spaced away from an (I-shaped) core segment 124 by one or more gaps 175 (e.g., air gaps).

The core segment 124 can have an elongate I-shaped body 140 including a first end 142 and a second end 144. In some embodiments, the elongate body 140 can extend linearly along its length between the first and second ends 142 and 144. In some embodiments, the elongate body can be curved along its length. A cross section of the body 140 taken transversely to a length of the body 140 can be rectangular. The first end 142 of the body 140 is disposed proximate to the terminal end 132 of the first elongate portion 126 of the core segment 122 and the second end 144 of the body 140 can be disposed proximate to the terminal end 136 of the second elongate portion 128 of the core segment 124.

A position of the core segment 124 with respect to the core segment 122 can be moved to adjust the size of the gap(s) 175 to increase or decrease a distance between the core segment 124 the terminal ends 132 and 136 of the legs 126 and 130; thereby adjusting an inductance of the resonant transformer 100. For example, the size of the gap(s) 175 can be decreased to increase an inductance of the resonant transformer or can be increased to decrease the inductance of the resonant transformer.

The size of the gap(s) 175 can be varied between a minimum value and a maximum value such that one or more ranges of inductance values can be achieved using the resonant transformer 100. As one example, where both of the taps 152 and 162 of the coils 150 and 160, respectively, are used in parallel with a load, the size of the gap(s) 175 can be controlled to operate the resonant transformer 100 within a first range of inductance values. As another example, when only one of the taps of one of the coils (e.g., tap 152 of coil 150) is used, the gap 175 can be controlled to operate the resonant transformer 100 within a second range of inductance values (e.g., twice the inductance values of the first range). As yet another example, where both of the coils 150 and 160 are used in series with a load, and the tap 162 is used as an output of the resonant transformer 100, the size of the gap(s) 175 can be controlled to operate the resonant transformer 100 within a third range of inductance values (e.g., twice the inductance values of the second range).

As a non-limiting example to illustrate an operation of exemplary embodiments of the resonant transformers described herein, the coils 150 and 160 can be electrically coupled in parallel and can include coil arrangements described herein having a specified number of turns to generate a voltage upwards of, for example, forty (40) kilovolts in response to an input voltage of about two thousand (2,000) to four thousand (4,000) kilovolts. The coil arrangement of the coils 150 and 160 to achieve this output voltage can create an inductance in the coil that allows the size of the gap to be relatively small when compared to conventional resonant transformers. For example, in some embodiments, when only the coils 150 is used the gap size can be varied from approximately one (1) millimeter to approximately fifty (50) millimeters to generate an inductance of approximately four hundred (400) Henries to approximately thirty (30) Henries, respectively, while some conventional resonant transformers generally require a maximum gap size of one-hundred fifty (150) millimeters to achieve the lower end of the inductance range. When the coils 150 and 160 are used in parallel, the same range for the size of the gap can be used to generate an inductance of approximately two hundred (200) Henries to approximately fifteen (15) Henries, while allowing the current rating of the resonant transformer to approximately double. When the coils 150 and 160 are used in series, the same range for the size of the gap can be used to generate an inductance of approximately eight hundred (800) Henries to approximately sixty (60) Henries.

Figure 2:
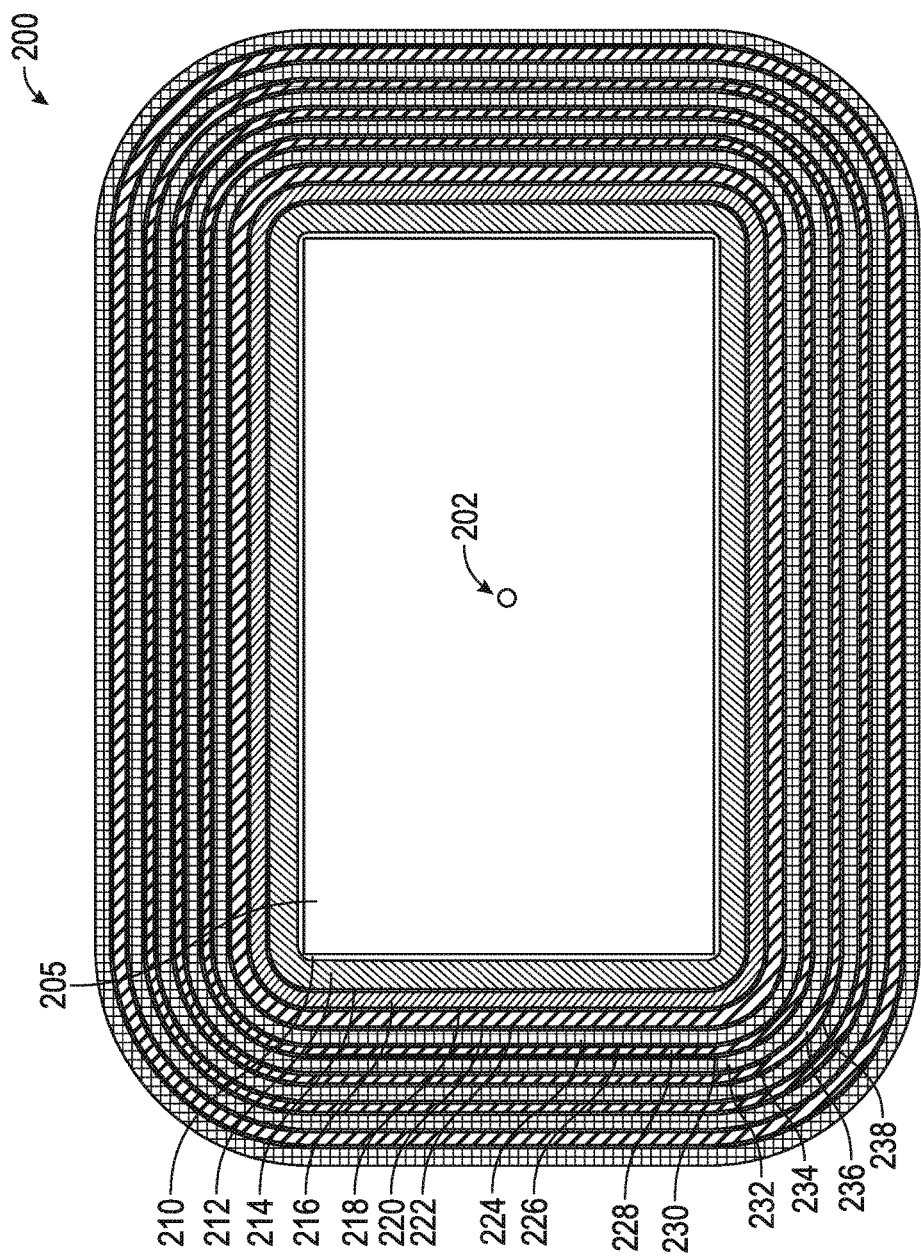
FIG. 2 depicts a cross-section of an exemplary portion of a coil arrangement taken transverse to a central axis of the coil arrangement in accordance with exemplary embodiments of the present disclosure.
Figure 3:
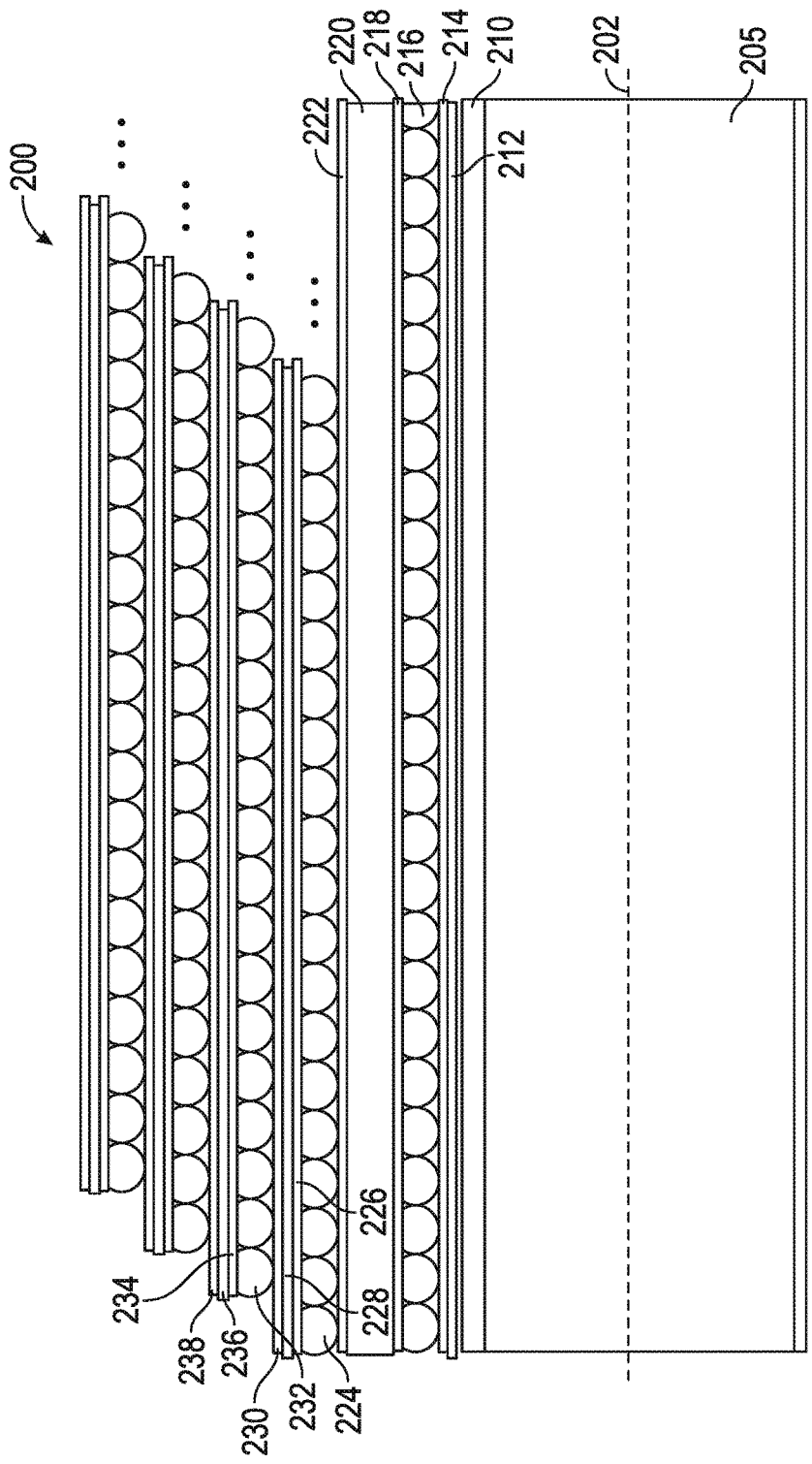
FIG. 3 depicts a cross-section of an exemplary portion of a coil arrangement taken along a central axis of the coil arrangement in accordance with exemplary embodiments of the present disclosure.

FIGS. 2-5 depict a coil arrangement 200 of a resonant transformer and portions thereof in accordance with exemplary embodiments of the present disclosure. For example, exemplary embodiments of the coil arrangement 200 can be used for embodiments of the conductor coils or windings 150 and/or 160 disposed, wound, or wrapped about portions (e.g., legs) of the core segment 122, as described herein. FIG. 2 depicts an exemplary cross-section of an exemplary portion of the coil arrangement 200 taken transverse to a central axis 202 of the coil arrangement 200. FIG. 3 depicts an exemplary cross-section of an exemplary portion of the coil arrangement 200 taken along the central axis 202 of the coil arrangement 200.

Referring to FIGS. 2 and 3, the coil arrangement 200 can be coaxially and concentrically wrapped or wound over a non-metallic core mandrel 210 that surrounds a magnetic core segment 205. The coil arrangement 200 can include coaxially and concentrically arranged layers of pressure tape, compressible insulating material, and conductive wire wound in successive layers over the core mandrel 210 in a generally repetitive pattern. In some embodiments, the pressure tape can be formed from Mylar and the compressible insulating material can be high voltage ethylene-propylene rubber (EPR). In some embodiments, a (first) layer 212 of an insulating material can substantially cover an outer surface of the core mandrel 210, and a (first) layer 214 of pressure tape can be disposed coaxially and concentrically over the (first) layer 212 of the insulating material.

A course 216 of grounding wire can be coaxially and concentrically wrapped or wound around the (first) layer 214 of the pressure tape along the portion of the length of the core mandrel 210 to form a coil having a generally helically shape and a specified number of total turns. The pressure tape generally prevents the turns of coils from individually indenting the insulating material such that coils uniformly compress the insulating material. In some embodiments, the grounding wire can be wrapped directly on the core mandrel 210. The course 216 of grounding wire can form a grounding coil of the coil arrangement 200 and can be wrapped or wound such that the grounding coil provides a net-zero induced voltage measured between a first end of the course 216 and a second end of the course 216. A first end of the grounding wire can be operatively coupled to ground at the first end of the mandrel and a second end of the grounding wire can be a free or "floating" end (e.g., not directly or indirectly electrically coupled to ground or another voltage potential).

Still referring to FIGS. 2 and 3, a (second) layer 218 of the pressure tape can be disposed over the course 216 of grounding wire to substantially cover the course 216 of the grounding wire, and a (second) layer 220 of the compressible insulating material can be disposed over the (second) layer 218 of the pressure tape to substantially cover the (second) layer 218 of the pressure tape. A (third) layer 222 of the pressure tape can be disposed over the (second) layer 220 of the compressible insulating material to substantially cover the (second) layer 220 of the compressible insulating material. In some embodiments, the layers 212, 214, 216, 218, 220, and 222 can be referred to as the grounding coil layer of the core arrangement 200.

The layers that are added to the core arrangement 200 after (or including) the (third) layer 222 of the pressure tape can form a repetitive pattern. Although two iterations of the repetitive pattern are described with respect in FIGS. 2 and 3, exemplary embodiments of the present disclosure can include more or fewer iterations of the repetitive pattern. For example, the pattern can be repeated, as necessary, to achieve a specified or desired inductance or output voltage with the resonant transformer. A first iteration of the repetitive pattern can include a (first) course 224 of step-up wire that can be coaxially and concentrically wrapped or wound around the (third) layer 222 of the pressure tape along the portion of the length of the core mandrel 210 to form a coil having a generally helically shape and a specified number of total turns. The pressure tape generally prevents the turns of coils from individually indenting the insulating material such that coils uniformly compress the insulating material. A first end of the (first) course 224 of coil can be connected to an input node of the resonant transformer or to an output of another coil in the resonant transformer. The (first) course 224 of step-up wire can form a voltage step-up coil of the coil arrangement 200 and can be wrapped or wound such that a non-zero voltage can be generated in the step-up coil (e.g., at a second end or anywhere along the length of the step-up coil) in response to an input voltage received at a first end of the step-up wire.

A (fourth) layer 226 of the pressure tape can be disposed over the (first) course 224 of the step-up wire to substantially cover the (first) course 224 of the step-up wire, and a (third) layer 228 of the compressible insulating material can be disposed over the (fourth) layer 226 of the pressure tape to substantially cover the (fourth) layer 226 of the pressure tape. A (fifth) layer 230 of the pressure tape can be disposed over the (third) layer 228 of the compressible insulating material to substantially cover the (third) layer 228 of the compressible insulating material. In some embodiments, the layers 224, 226, 228, and 230 can be referred to as a (first) step-up coil layer of the core arrangement 200.

To illustrate the repetitive pattern, a second iteration of the repetitive pattern is shown to include a (second) course 232 of the step-up wire that can be coaxially and concentrically wrapped or wound around the (fifth) layer 230 of the pressure tape along the portion of the length of the core mandrel 210 to form a coil having a generally helically shape and a specified number of total turns that is less than the number of turns of the preceding step-up coil. The (second) course 232 of wire is a continuation of the step-up wire used to form preceding step-up coil (or is electrically coupled to an end of the step-up wire used to form the preceding step-up coil). The pressure tape generally prevents the turns of coils from individually indenting the insulating material such that coils uniformly compress the insulating material. The (second) course 232 of wire can form another voltage step-up coil of the coil arrangement 200.

A (sixth) layer 234 of the pressure tape can be disposed over the (second) course 232 of the wire to substantially cover the (second) course 232 of the wire, and a (fourth) layer 236 of the compressible insulating material can be disposed over the (sixth) layer 234 of the pressure tape to substantially cover the (sixth) layer 234 of the pressure tape. A (seventh) layer 238 of the pressure tape can be disposed over the (fourth) layer 236 of the compressible insulating material to substantially cover the (fourth) layer 236 of the compressible insulating material. In some embodiments, the layers 232, 234, 236, and 238 can be referred to as a (second) step-up coil layer of the core arrangement 200.

As shown in FIGS. 2 and 3, each step-up coil layer in the coil arrangement 200 can be formed sequentially by coaxially and concentrically wrapping or winding a course of step-up wire around a previous coil layer (e.g., a previous step-up coil layer or a grounding coil layer) along at least a portion of a length of the core mandrel 210. The coil in the grounding coil layer can be wrapped or wound about at least a portion of the length of the core mandrel 210 such that there are no coil layers between the grounding coil layer and the core mandrel 210. In exemplary embodiments, the coil layers of the core arrangement 200 (e.g., step-up coil layers and a grounding coil layer) and the core mandrel 210, can each be generally disposed coaxially and concentrically with respect to each other.

A quantity of step-up coil layers in the coil arrangement 200 can determine an output voltage that is output by a resonant transformer (e.g., embodiments of the transformers described herein) in response to an input voltage. In exemplary embodiments, each successive/consecutive step-up coil layer can include fewer turns than the preceding step-up coil layer to form a stepped or graded geometry of step-up coil layers having an generally sloping profile at the ends of the coil arrangement 200, as shown in FIG. 3. A total number of cumulative turns in the step-up coil layers can be specified to achieve a desired output voltage in response to a specified input voltage. The stepped or graded structure of the coil arrangement can provide electrical stability to the coil arrangement to reduce or mitigate undesirable discharges for the coil arrangement during use. In exemplary embodiments, the quantity of step-up coil layers can be selected for generating a high voltage (e.g., the quantity of step-up coil layers can be selected to generate hundreds of volts, kilovolts, tens of kilovolts, hundreds of kilovolts) in response to a moderate input voltage (e.g., kilovolts). As a non-limiting example, in some embodiments, the coil arrangement 200 can be configured to receive an input voltage of approximately zero (0) to approximately two (2) kilovolts, and can be configured to output approximately zero (0) to forty (40) kilovolts.

Figure 4:
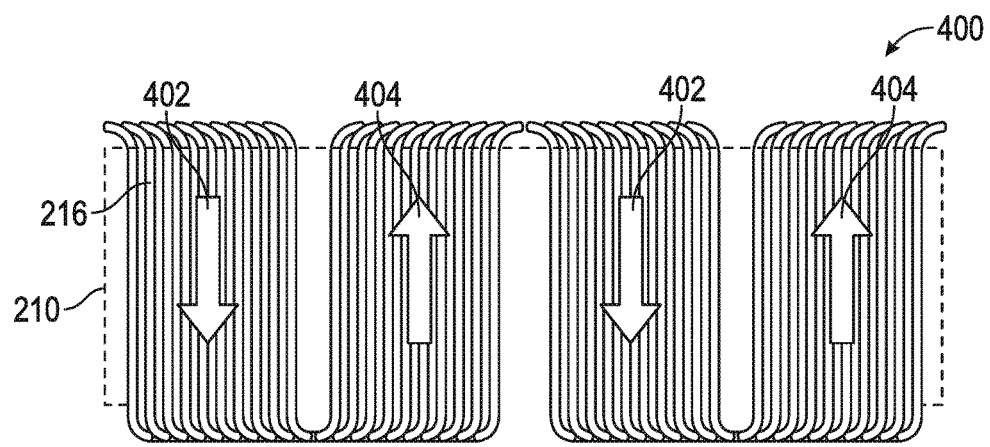
FIG. 4 is a schematic diagram of an exemplary winding of wire to form a grounding coil for a coil arrangement in accordance with exemplary embodiments of the present disclosure.

FIG. 4 is a schematic diagram of an exemplary winding of the course 216 of the grounding wire to form a grounding coil 400 for the coil arrangement 200. The course 216 of wire can be wrapped or wound about the core mandrel to achieve a net-zero induced voltage measured between the first end and the second end of the grounding coil 400 formed by the course 216 of grounding wire. To achieve the net-zero induced voltage, the grounding wire is wound such that a total number of turns of the grounding coil in the clockwise direction along the length of the core mandrel 210 is equal to or substantially equal to a total number of turns in the counter clockwise direction along the length of the core mandrel for the course 216 of grounding wire. For example, half of the turns for the course 216 of grounding wire (i.e., forming the grounding coil) can be in the clockwise direction and half of the turns for the course 216 of grounding wire can be in the counter clockwise direction.

To reduce voltage build-up within the grounding coil, a direction in which the course 216 of grounding wire is wrapped or wound can alternate (e.g., between clockwise and counterclockwise directions about the core mandrel). For example, in exemplary embodiments, the course 216 of wire (i.e. the grounding coil) can be wrapped or wound so that the wire alternates between a specified number of turns about the core mandrel 210 in a first generally circumferential direction along a length of the core mandrel 210 as shown by arrow 402 (e.g. a specified number of turns in a clockwise direction) and a specified number of turns about the core mandrel 210 in a second circumferential direction along a length of the core mandrel as shown by arrow 404 (e.g. a specified number of turns in a counter clockwise direction). As shown in FIG. 4, for example, the course 216 of grounding wire can be wrapped and wound about the core mandrel 210 to alternate between the same number of turns in the clockwise and counterclockwise directions (e.g., alternating between ten turns in the clockwise direction and ten turns in the counter clockwise direction). While FIG. 4 illustrates a non-limiting example of a pattern of alternating turns that form the grounding coil, exemplary embodiments of the present disclosure can be implemented using other patterns of alternating turns so that the wire is wound to form a grounding coil that has an equal or substantially equal number of turns in the clockwise direction along the length of the core mandrel 210 and in the counter clockwise direction along the length of the core mandrel 210 for the (first) course 216 of the grounding wire.

Figure 5:
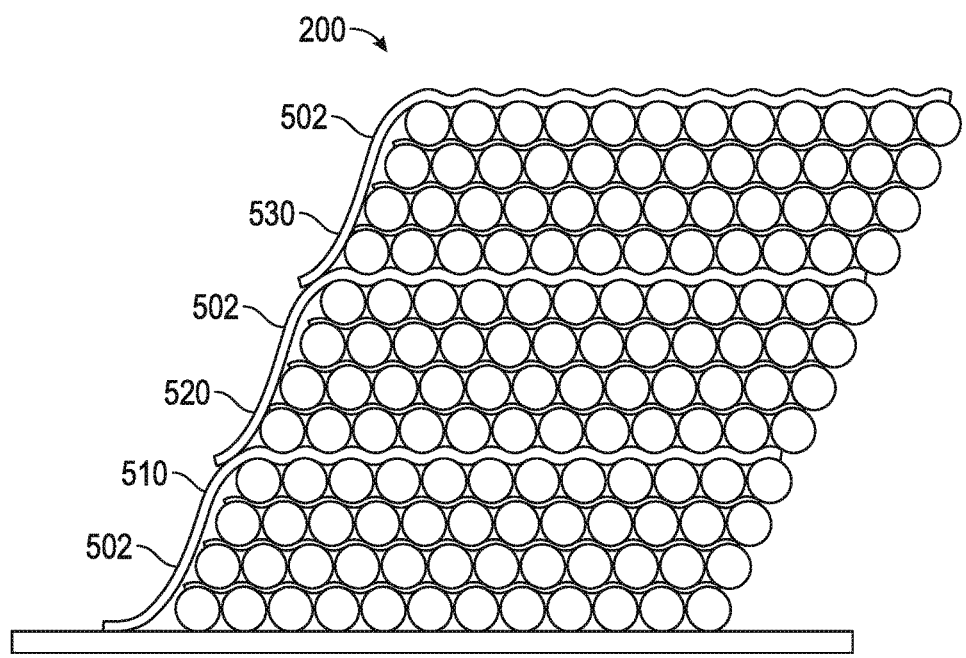
FIG. 5 is a schematic diagram of an exemplary electrical stress control arrangement for a coil arrangement in accordance with exemplary embodiments of the present disclosure.

FIG. 5 shows an electrical stress control arrangement that can be implemented for the coil arrangement 200. As shown in FIG. 5, grading tape 502 can be disposed along the sloped profile of the stepped or graded ends of the coil arrangement 200 to limit the electrical stress on the coil arrangement 200 at the ends of the coil arrangement 200. The grading tape 502 can be inserted between step-up coil layers and can extend generally towards the core mandrel 210. As the grading tape 502 approaches the core mandrel 210, the grading tape can be bent to transition from a generally radial direction to a generally longitudinal direction with respect to the core mandrel. The grading tape 502 can be disposed with respect to the core mandrel 210 such that the grading tape 502 is in proximity to, but does not come in contact with the ground coil (e.g., is spaced away from the ground coil by, for example, approximately one centimeter). The grading tape 502 can be formed of a non-linear dielectric material that limits the electrical stress at the ends of the coil arrangement 200 to prevent or reduce undesirable electrical discharges or breakdowns at the ends of the coil arrangement 200. For example, in some embodiments, the grading tape 502 can be formed by a polymer base, such as EPR rubber, with ferroelectric or metal oxide powdered materials to impart dielectric non-linearity to the grading tape 502.

In exemplary embodiments, pieces of the grading tape 502 can be layered and stacked radially from the grounding coil to an outer step-up coil layer. For example, a first piece of grading tape 510 can extend from proximate to grounding coil up to a specified number of step-up coils. A second piece of pressure tape 520 can begin at and overlap the end of the first piece of grading tape 510 and can extend up to a specified number step-up coil layers. A third piece of grading tape 530 can begin at and overlap the end of the second piece of grading tape 510 and can extend up to a specified number step-up coil layers. In general, the grading tape 502 is disposed to cover the edge of the coil arrangement 200 and extend to be proximate to the grounding coil to limit or relieve electrical stress that may build up at the ends of the coil arrangement 200.

Embodiments of the coil arrangement 200 described with respect to FIGS. 2-5 can advantageously reduce the likelihood of undesirable electrical discharges due to the configuration of the grounding coil layer, the pressure tape layers, the insulating material layers, the use of fewer turns on successive layers of step-up coil to create a sloped profile, and/or the use of the grading tape along the ends of the coil arrangement. The reduction of the likelihood of undesirable electrical discharge advantageously allows exemplary embodiments of the resonant transformers that utilize the coil arrangement 200 to operate safely and effectively without require the coil arrangement for be immersed in an insulating oil. As a result, exemplary embodiments of the present disclosure can include resonant transformers that are lighter than conventional resonant transformers. The reduced likelihood of undesirable electrical discharges also allows the coil arrangement 200 to include more turns than coils in convention resonant transformers, which allows exemplary embodiments of the resonant transformers to have higher inductances and higher output voltages than convention resonant transformers. By creating coils according the embodiments of the coil arrangement 200 with higher inductances than conventional coil arrangements, the size of gap in exemplary embodiments of resonant transformers described herein can be smaller than conventional resonant transformers, while allowing for a wide range of inductances suitable for achieving resonance with a wide range of load capacitances.

Figure 6:
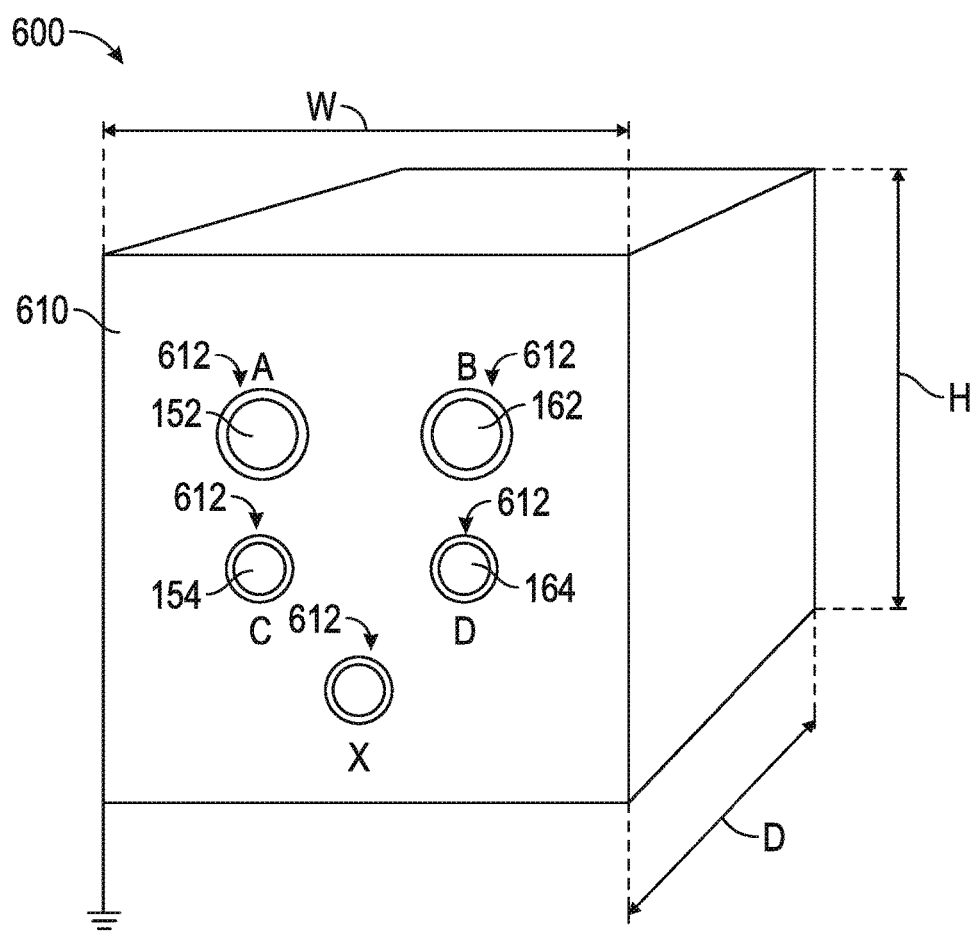
FIG. 6 depicts an exemplary main housing within which at least a portion of the resonant transformer of FIGS. 1A-B can be disposed in accordance with exemplary embodiments of the present disclosure.

FIG. 6 depicts an exemplary main housing 600 within which is housed at least a portion of an embodiment of the resonant transformer 100 having coils 150 and 160 (FIGS. 1A-B) formed according to embodiments of the coil arrangement 200 (FIGS. 2-5). For example, in some embodiments, the core segments 122 and 124 (FIGS. 1A-B) can be disposed within the housing 600 or the core segment 122 can be disposed within the housing 600 and the core segment 124 can be disposed external to the housing 600. The housing 600 can have a width W, a depth D, and a height H. In some embodiments, a volume of the housing can be less than approximately 25,000 cubic inches due to the structure of the coil arrangement as well as the positioning of the core segments and the maximum size of the gap need to produce an inductance suitable for testing electrical power cables of different lengths. As shown in FIG. 6, a wall 610 of the housing 600 can include one or more bushings (or ports) 612 through which the taps 152, 154, 162, and 164 can be accessed to configure the resonant transformer to connect an input voltage to the resonant transformer 100 and to connect a load to one or more of the taps 152, 154, 162, and/or 164.

In exemplary embodiments, because the coil arrangement 200 of the coils 150 and 160 can be configured to reduce and/or minimize undesirable discharge of the coils 150 and 160, exemplary embodiments of the present disclosure do not generally require that an interior of the main housing 600 be filled with an insulating oil. The main housing 785 can be sealed to maintain a gas under a low to moderate pressure (e.g., approximately 0 to approximately 5 psig). Because the coil arrangement allows the interior of the housing 600 to be filled with air or an inert gas, rather than an insulting oil, exemplary embodiments of the resonant transformers described herein can be lighter than conventional resonant transformers. By positioning the core segment 124 and gap 175 (FIGS. 1A-B) outside of the housing 600, an interior volume of the housing 600 can be reduced in comparison to conventional resonant transformers. The combination of the coil arrangement and the position of the core segment 124 external to the housing 600 provides for a smaller, lighter, efficient, and stable variable inductance resonant transformer as compared to conventional resonant transformers.

FIGS. 7-10 depict various exemplary embodiments of resonant transformers in accordance with the present disclosure.

Figure 7A:
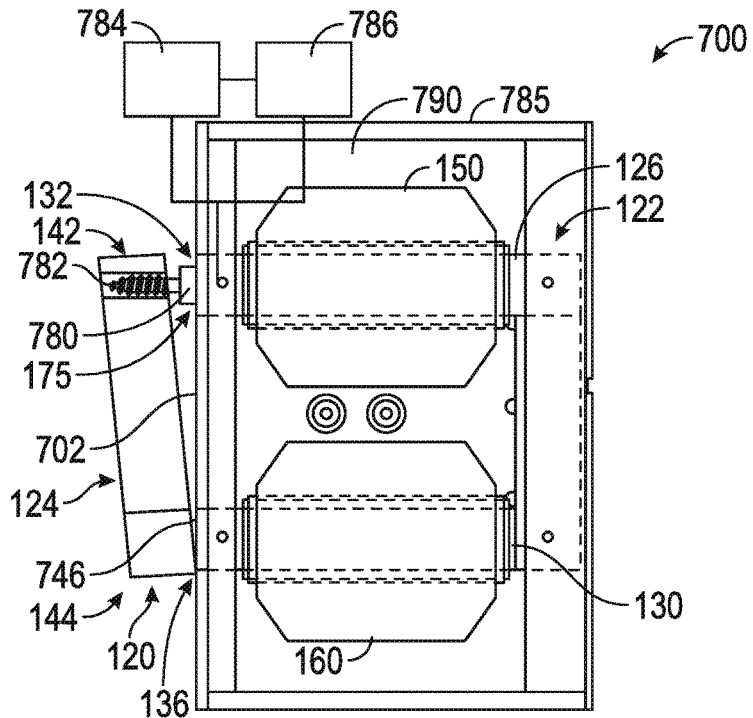
FIG. 7A depicts a schematic diagram of a resonant transformer in accordance with exemplary embodiments of the present disclosure.
Figure 7B:
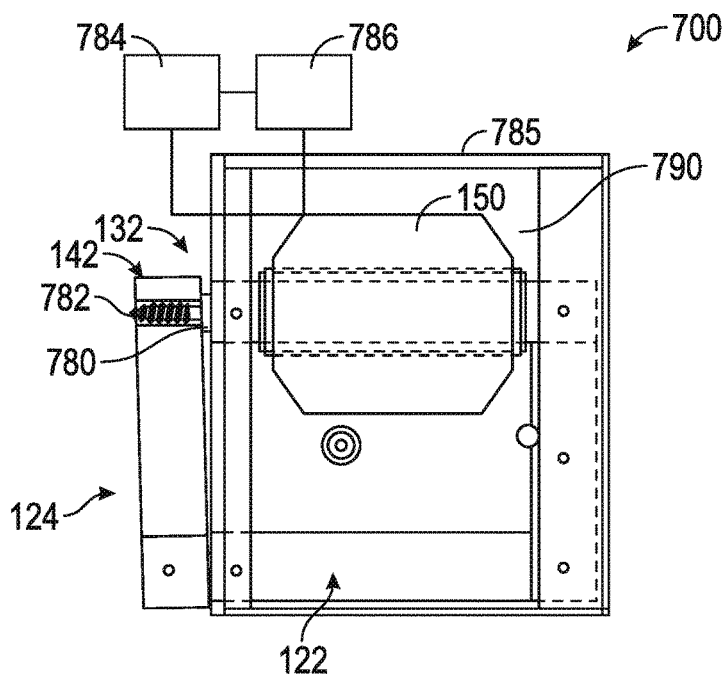
FIG. 7B depicts a schematic diagram of a resonant transformer having a single coil in accordance with exemplary embodiments of the present disclosure.

FIG. 7A depicts a schematic diagram of the resonant transformer 700 where the core segment 124 is disposed externally to a housing 785 and is operatively coupled to the housing 785 by a joint 746 (e.g., a hinge) in accordance with exemplary embodiments of the present disclosure. As shown in FIG. 7A, the resonant transformer can include the U/I-shaped magnetic core 120 formed by the core segment 122 and the core segment 124, and the conductor coils or windings 150 and 160 disposed, wound, or wrapped over the core mandrels disposed on the legs 126 and 130 of the core segment 122 according to embodiments of the coil arrangement described herein. In some embodiments, the resonant transformer 700 can include only one of the coils 150 or 160, as shown in FIG. 7B.

A spatial relationship between the core segment 122 and the core segment 124 can be adjustable to adjust an inductance of the resonant transformer. As shown in FIGS. 7A and 7B, a distance between the second end 144 of the core segment 124 and terminal end 136 of the second leg 130 of the core segment 122 remains generally constant and a distance between the first end 142 of the core segment 124 and the terminal end 132 of the first leg 126 of the core segment 122 can be varied to control an inductance of the resonant transformer. In some embodiments, the second end 144 can be disposed proximate to the terminal end 136, but not in contact with the terminal end 136 such that substantially fixed gap exists between the second end 144 and the terminal end 136.

In exemplary embodiments, the second end 144 can be operatively coupled to the terminal end 136 the housing 785 via a joint 746 formed by, for example, a hinge, a ball and socket joint, ratchet mechanism, and/or any other suitable pivoting or rotating structure. The first end 142 of the core segment 124 can be moved away from or towards the terminal end 132 by operation of the joint 746 (e.g., between a first position and a second position). As one example, the first end 142 can be moved to be positioned proximate to terminal end 132 to define a minimum gap size or can be moved away from (or further away from) the terminal end 132 to increase the size of the gap 175 (e.g., to a maximum gap size or an intermediate gap size) and adjust the inductance of the resonant transformer 700.

Figure 7C:
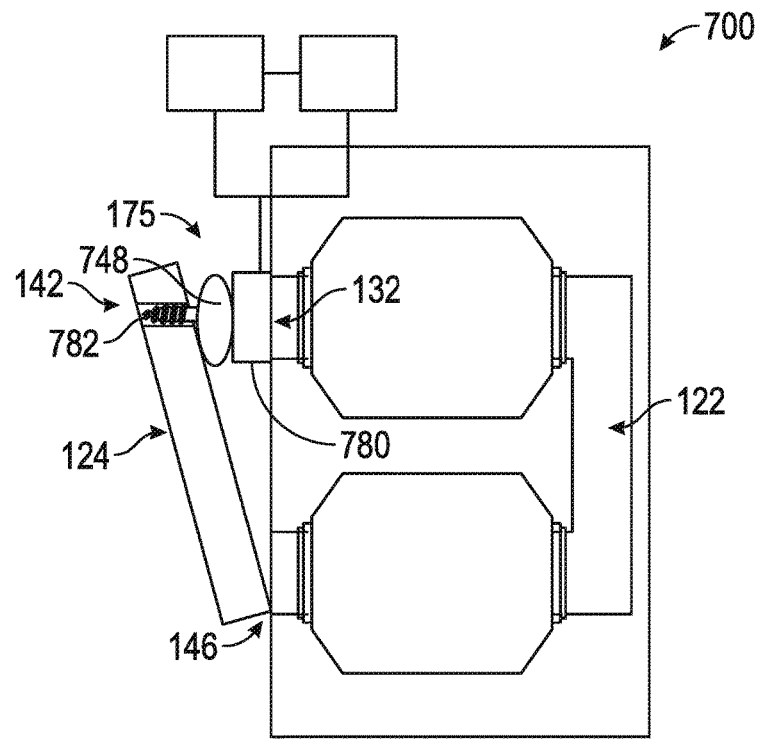
FIG. 7C depicts a schematic diagram of a resonant transformer of FIG. 7A with an inflatable member to stabilize a portion of a split magnetic core in accordance with exemplary embodiments of the present disclosure.

In some embodiments, the resonant transformer 700 can include an inflatable member 748 that can be positioned in the gap 175 between the terminal end 132 and the first end 142, as shown in FIG. 7C, such that the inflatable member 748 can be inflated to fill or at least partially fills the gap 175. The inflatable member 748 can be inflated such that it presses against the core segment 124 and the core segment 124 compresses the inflatable member 748 at an interface between the core segment 124 and the inflatable member 748. In exemplary embodiments, the inflatable member 748 can provide mechanical stability to resonant transformer by filling the gap 175 to prevent or reduce undesirable movement of the core segment 124 with respect to the terminal end 132 of the core segment 122 due to, for example, vibrations or other mechanical shocks. In some embodiments, the movement of the core segment 124 about the joint 746 can be controlled manually by a user. In some embodiments, the movement of the core segment about the joint 746 can be controlled automatically by an actuator. While exemplary embodiments have been illustrated herein using inflatable members, exemplary embodiments of the present disclosure can use solid non-magnetic wedge-shaped members instead of or in addition to the inflatable members to provide stability to the resonant transformers by inserting the non-magnetic solid members into the space between the core segments.

In exemplary embodiments, an actuator 780 can be operatively coupled to the core segment 124 to move the core segment 124 about the joint 746. For example, as shown in FIGS. 7A-7C, the actuator 780 can be operatively coupled to the first end 142 of the core segment 124 to control a distance (e.g., the gap 175) between the first end 142 and the terminal end 132; thereby controlling the inductance of the resonant transformer 700. In some embodiments, the actuator 780 can be a screw-type actuator in which a threaded shaft 782 operative coupled to the core segment 124 rotates to move the core segment towards or away from the core segment 122. The actuator 780 can be disposed inside or outside of the housing 785.

In some embodiments, the actuator 780 can be manually and/or programmatically controlled to adjust the inductance of the resonant transformer to a specified value. As one example, in some embodiments, a control interface 786 including one or more controls (e.g., buttons, knobs, etc.) can be operatively coupled to the actuator to allow a user of the resonant transformed to control the actuator 780. As another example, in some embodiments, a processing device 784 (e.g., microprocessor, microcontroller etc.) can be operatively coupled to the actuator 780 and can be programmed and/or configured to automatically and/or programmatically control the actuator 780 to control an inductance of the resonant transformer 700 based on a distance between the first end 142 and the terminal end 132 in response to user inputs and/or in response to sensed and/or monitored parameters from which a desired inductance of the resonant transformer 700 can be derived.

As shown in FIG. 7A, the core segment 122, coil 150, and coil 160 can be disposed within the main housing 785, while the core segment 124 can disposed outside of the main housing 785. The main housing 785 can include a barrier or wall 702 disposed between the core segments 122 and 124 to position the gap 175 outside of the housing. By positioning the core segment 124 (and the gap 175) outside of the main housing 785, exemplary embodiments of the present disclosure can substantially reduce the dimensions of the main housing as compared to tank housings of conventional resonant transformers that are suitable for producing high voltages (e.g., tens or hundreds of kilovolts), which can result in a smaller and lighter resonant transformer than conventional resonant transformer designs. The core segment 124 can be exposed to the atmosphere at atmospheric pressure. In some embodiments, the core segment 124 can be disposed within a secondary housing or shroud. While the core segment 124 is described as being external to the main housing 785, the core segment 124 of exemplary embodiments of the resonant transformers described herein can be disposed within the housing.

In exemplary embodiments, the coil arrangement of the coils 150 and 160 can be configured as described herein with respect to FIGS. 2-5 to reduce and/or minimize undesirable discharge of the coils 150 and 160 such that exemplary embodiments of the present disclosure do not generally require that the interior of the main housing be filled with an insulating oil. In the present embodiment, the interior of the main housing 785 can be filled with a gas at atmospheric or moderate pressure. For example, the interior of the main housing 785 can be filled with air (e.g., atmosphere) or an inert gas (such as nitrogen). The main housing 785 can be sealed to maintain the gas 790 under a low to moderate pressure (e.g., ~0 to ~5 psig). The wall 702 can be formed from a non-conductive, non-magnetic material. For example, in some embodiments, the wall 702 can be formed from Plexiglas, fiberglass, acrylic, plastic or other polymers, carbon-based composite materials, and/or any other suitable materials.

Because the coil arrangements described herein allow the interior of the housing 785 to be filled with air or an inert gas, rather than an insulting oil, exemplary embodiments of the resonant transformers described herein can be lighter than conventional resonant transformers. The combination of the coil arrangement and the position of the core segment 124 external to the housing 785 provides for a smaller, lighter, efficient, and stable variable inductance resonant transformer. While the cores segment 124 has been described as being external to the housing in some embodiments, those skilled in the art will recognize that the core segment 124 can be disposed within the housing 785 while still realizing some advantageous of exemplary embodiments of the present disclosure as compared to convention resonant transformer designs.

Figure 8A:
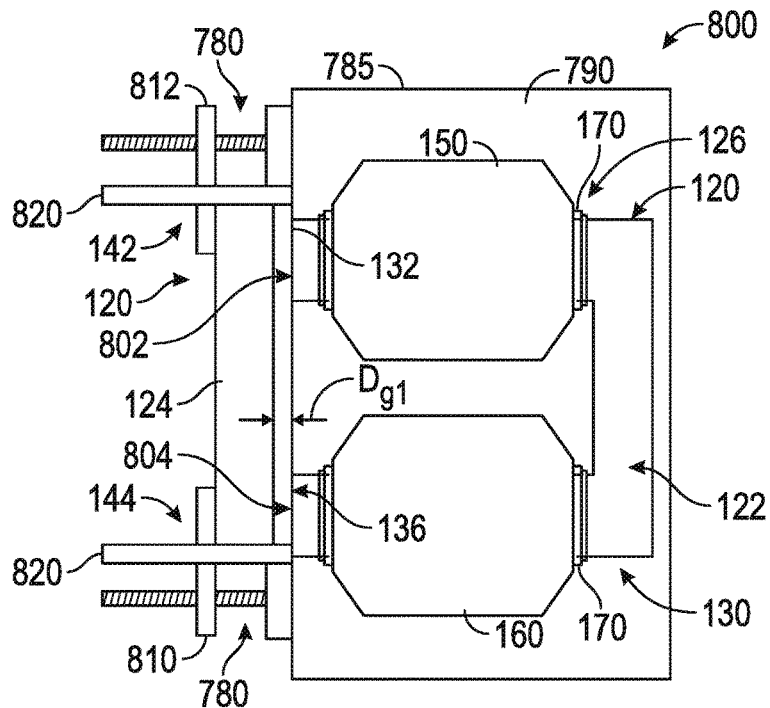
FIGS. 8A and 8B are schematic diagrams of a resonant transformer in accordance with exemplary embodiments of the present disclosure.
Figure 8B:
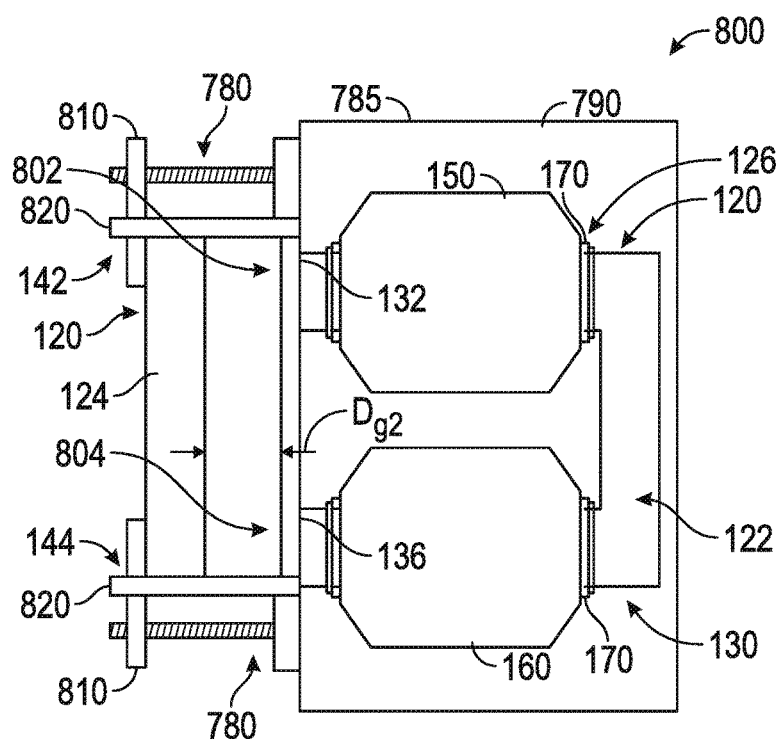
Figure 8C:
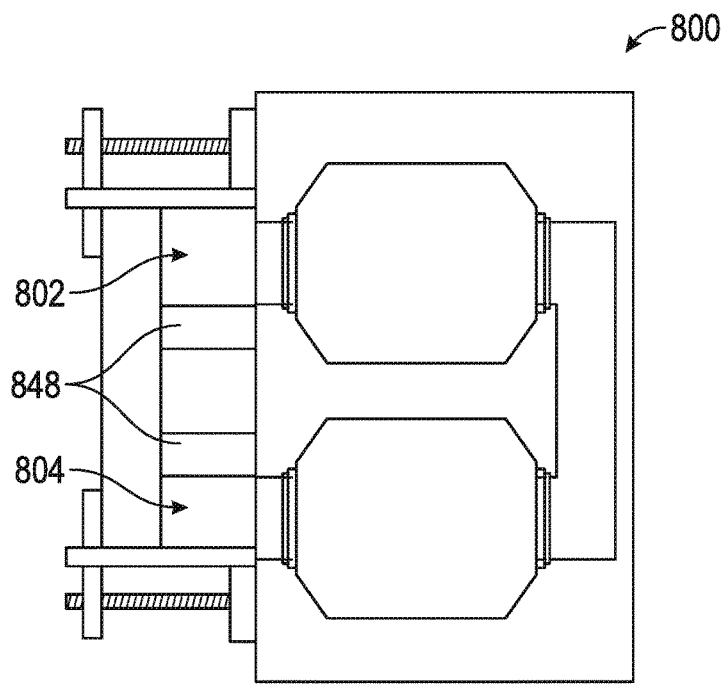
FIG. 8C depicts a schematic diagram of a resonant transformer of FIGS. 8A and 8B with inflatable members to stabilize a portion of a split magnetic core in accordance with exemplary embodiments of the present disclosure.

FIGS. 8A and 8B are schematic diagrams of a resonant transformer 800 in accordance with exemplary embodiments of the present disclosure. The resonant transformer 800 can include embodiments of the magnetic core 120 formed by the core segment 122 and the core segment 124, the conductor coils or windings 150 and 160 disposed, wound, or wrapped over the core mandrel 170 disposed on the legs 126 and 130 of the core segment 122, and the main housing 785 within which the core segment 122, coils 150 and 160, and gas 790 are disposed, as described herein. FIG. 8A shows the first and second ends 142 and 144 of the core segment 124 positioned to be proximate to the terminal ends 132 and 136 of the core segment 122, respectively (e.g., spaced away from the terminal ends 132 and 136 by a minimum distance $D_{g1}$). FIG. 8B shows the first and second ends 142 and 144 of the core segment spaced away from the terminal ends 132 and 136 of the core segment 122 by a maximum distance $D_{g2}$ to increase the size of gaps 802 and 804, respectively. In some embodiments, the resonant transformer 800 can include non-magnetic inflatable members 848 that can be positioned in the gaps 802 and 804, as shown in FIG. 8C, such that the inflatable members 848 can be inflated to at least partially fill the air gaps 802 and 804 of the resonant transformer 800. In some embodiments, the resonant transformer 800 can include one of the coils 150 or 160.

As shown in FIGS. 8A and 8B, both the first and second ends 142 and 144 of the core segment 124 can be moved linearly and uniformly away or towards the core segment 122. For example, a guide member 810 can be disposed at each of the first and second ends 142 and 144 of the core segment 124, and can be configured to engage a corresponding track 820 that is mounted to and extends substantially perpendicularly away from wall of the main housing 785. The actuators 780 can be operatively coupled to the wall and the core segment 124, and can be actuated to move the core segment 124 towards and away from the wall. As the actuators 780 translate the core segment 124, the guide member 810 at each of the first and second ends 142 and 144 slide along the corresponding track 820 so that the core segment 124 translates alone the tracks 820 and can be positioned to be in contact with the terminal ends 132 and 136 or spaced away from the terminal ends 132 and 136 to adjust the inductance of the resonant transformer 800.

Figure 9:
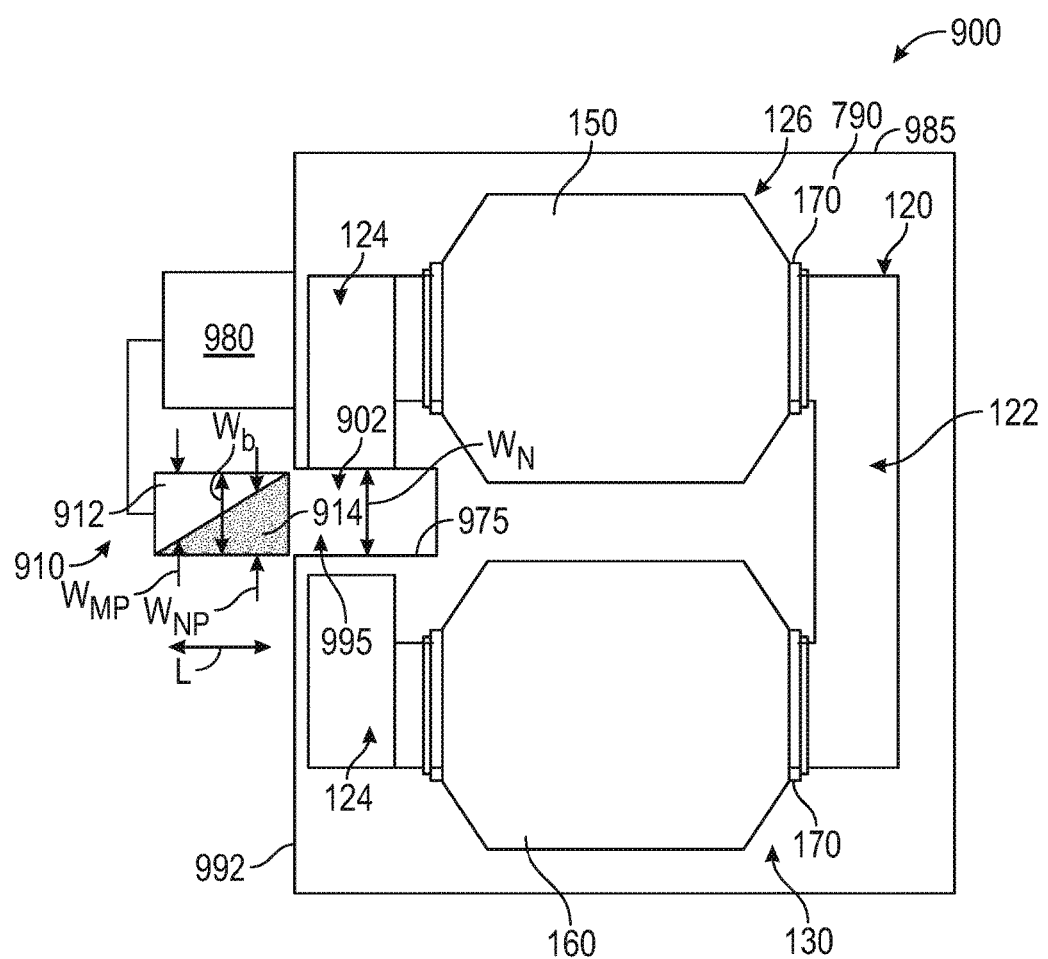
FIG. 9 is a schematic diagram of a resonant transformer in accordance with exemplary embodiments of the present disclosure that utilizes an insert to vary an inductance of the resonant transformer.

FIG. 9 is a schematic diagram of a resonant transformer 900 in accordance with exemplary embodiments of the present disclosure. The resonant transformer 900 can include embodiments of the magnetic core 120 formed by the core segment 122 and the core segment 124, the conductor coils or windings 150 and 160 disposed, wound, or wrapped over the core mandrels 170 disposed on the legs 126 and 130 of the core segment 122. As shown in FIG. 9, the core segments 122 and 124 of the core 120 can be permanently connected or integrally formed, and a slice of magnetic material that forms the core segment 124 can be removed from the core segment 124 to form a notch 995 in the core segment 124 that is devoid of magnetic material. The size of the notch 995 can correspond to a maximum size of a gap 902. The core segments 122 and 124 can be disposed in a housing 985, which can be filled with the gas 790 and a recess 975 can be formed in a wall 992 of the housing 985 and can extend into the notch 995. The recess 975 in the housing can coincide with the notch 995 and can have a width $W_N$. The recess 975 can be configured to receive the plunger insert 910. The dimensions of the plunger insert 910 can correspond the recess 975 such that the plunger insert 910 fits completely and tightly or snugly within the recess 975 to fill the notch 995. To achieve a variable inductance, plunger insert 910 can be inserted and/or removed from the recess 975. An actuator 980 can be operatively coupled to the plunger insert 910 to control a movement of the plunger insert 910.

The plunger insert 910 can be formed by a tapered or wedge-shaped magnetic portion 912 composed of a magnetic material and a tapered or wedge shaped non-magnetic portion 914 composed of a non-magnetic material. As shown in FIG. 9, the plunger insert 910 can have a rectangular body that extends along a longitudinal axis L of the plunger insert 910. The body can have a width $W_b$ measured perpendicularly to the longitudinal axis L, the portion 912 can have a width $W_{MP}$, and the portion 914 can have a width $W_{NP}$. The width $W_b$ of the body can be slightly smaller than the width $W_N$. The mathematical sum of the width $W_{MP}$ and the width $W_{NP}$ at any point along longitudinal axis L of the body can equal the width $W_b$ of the body at such point. In exemplary embodiments, at a first end of the body, the width $W_{MP}$ of magnetic portion can be approximately equal to the width $W_b$ of the body, and at a second end of the body, the width $W_{MP}$ of magnetic portion can be approximately zero. At the first end of the body, the width $W_{NP}$ of non-magnetic portion can be approximately zero, and at the second end of the body, the width $W_{NP}$ of magnetic portion can be approximately equal to the width W of the body. In some embodiments, the width $W_{MP}$ of magnetic portion can decrease linearly from the first end to the second end, and the width $W_{NP}$ of non-magnetic portion can increase linearly from the first end to the second end. In some embodiments, the width $W_{MP}$ of magnetic portion and the width $W_{NP}$ of non-magnetic portion can change non-linearly along the longitudinal axis L.

The actuator 980 can be operatively coupled to the plunger insert 910 to move the plunger insert 910 into and out of the recess 975 to adjust the size of the gap 902, and therefore, the inductance of the resonant transformer 900. For example, the plunger insert 910 can be controlled by the actuator 980 to position the plunger insert 910 so that the magnetic portion 912 is disposed in the notch 995. The width $W_{MP}$ of the magnetic portion 912 of the plunger insert 910 can determine the inductance of the resonant transformer 900. As one example, when the width $W_{MP}$ of the magnetic portion 912 that is substantially equal to the width $W_b$ of the body is disposed in the notch, the size of the gap 902 can be reduced by the width $W_{MP}$ of the magnetic portion 912 disposed in the recess 975 and the inductance of the resonant transformer will be at its maximum value. As another example, when the magnetic portion 912 of the inert 910 is removed from the recess 975, the size of gap 902 can be at its maximum and the inductance of the resonant transformer will be at its minimum value. Thus, the width $W_{MP}$ the magnetic portion 912 can be used to change a width of the gap 902 to change the inductance of the resonant transformer 900.

Figure 10A:
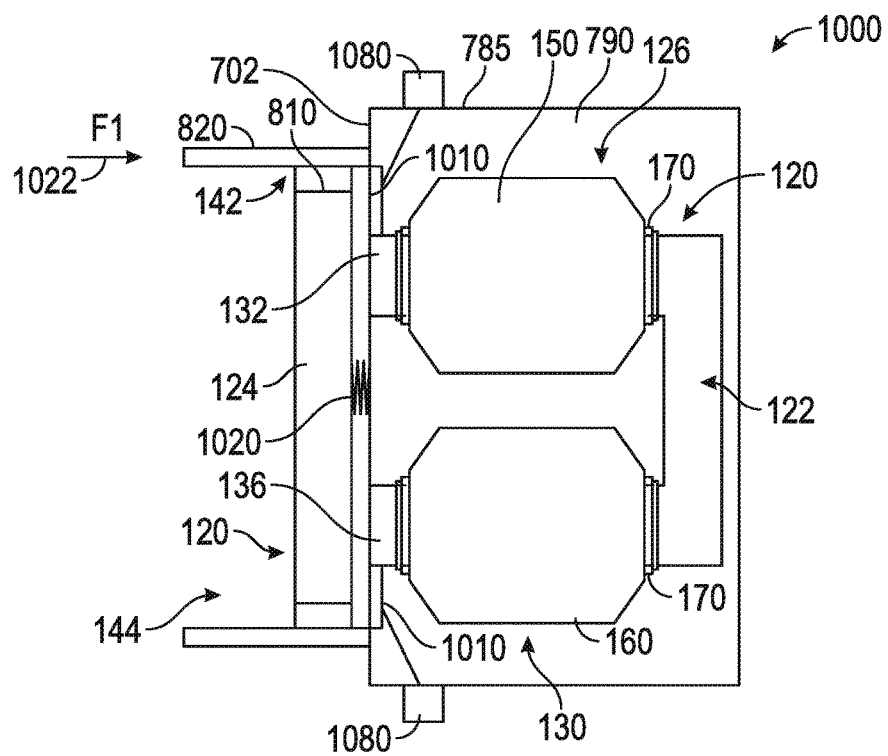
FIGS. 10A and 10B are schematic diagrams of a resonant transformer in accordance with exemplary embodiments of the present disclosure that use inflatable members to adjust an inductance of the resonant transformer.
Figure 10B:
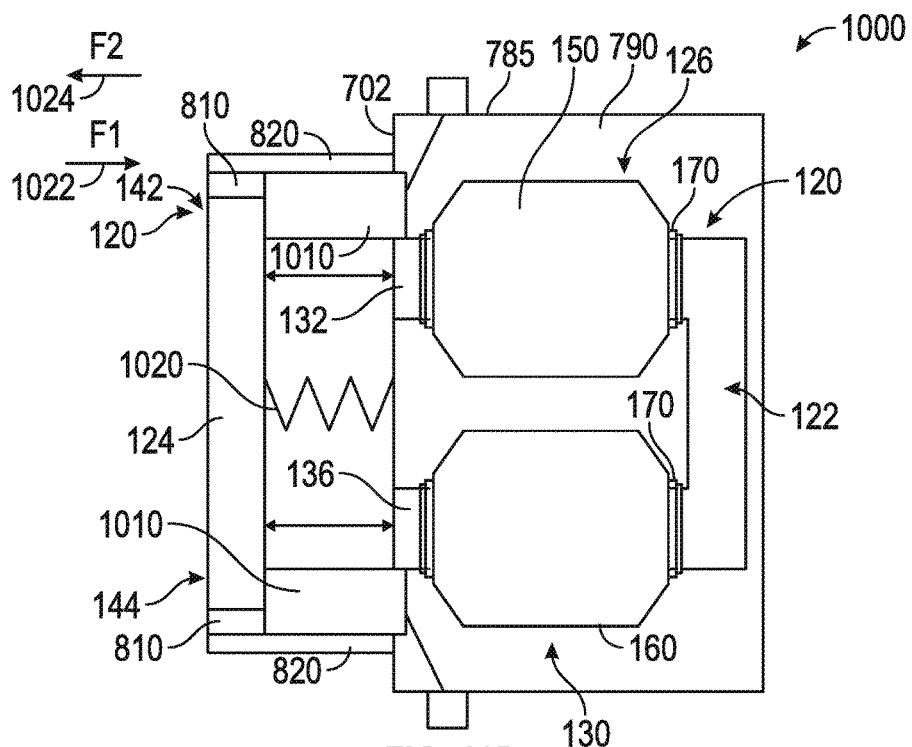

FIGS. 10A and 10B are schematic diagrams of a resonant transformer 1000 in accordance with exemplary embodiments of the present disclosure. The resonant transformer 1000 can include embodiments of the magnetic core 120 formed by the core segment 122 and the core segment 124, the conductor coils or windings 150 and/or 160 disposed, wound, or wrapped over the core mandrels 170 disposed on the legs 126 and 130 of the core segment 122, the guide member(s) 810, the track(s) 820, the main housing 785 within which the core segment 122, coils 150 and 160, and gas 790 are disposed, as described herein.

As shown in FIGS. 10A and 10B, the first and second ends 142 and 144 of the core segment 124 can be moved linearly and uniformly away from or towards the core segment 122. A non-metallic solid or inflatable insert is squeezed between the core segments 122 and 124 to control the gap size and prevent vibrations.

One or more resilient members 1020 (e.g., springs) can be operatively coupled between the core segment 124 and the wall 702. The resilient member 1020 can be biased to urge the core segment 124 towards the wall 702 and to force the core segment 124 to be in contact with or proximate to the core segment 122 when the inflatable members 1010 are in the first state (e.g., substantially deflated so that the core segment 124 is in contact with the core segment 122). In exemplary embodiments, the resilient members 1020 can exert a force F1 on the core segment 124 in the direction shown by arrow 1022, while the inflatable inserts exert a force in the opposite direction, tending to increase the size of the gap.

One or more actuators 1080 (e.g., pumps) can be operatively coupled to the inflatable members 1010, and can be operated to inflate and/or deflate the inflatable members 1010. When the actuators 1080 are operated to inflate the inflatable members 1010, the inflatable members 1010 can exert a force F2 on the core segment 124 in a direction opposite that of the force F1 exerted on the core segment 124 by the spring 1020 (as shown by arrow 1024). As the inflatable members 1010 are inflated, the force F2 exerted on the cores segment 124 increases. When the force F2 is greater than the force F1, the inflatable members 1010 urge the core segment 124 away from the wall 702 and the core segment 122. A distance between the core segments 124 and 122 can be controlled by controlling a degree to which the inflatable members 1010 are inflated. For example, when the inflatable members 1010 are substantially deflated, the core segment 124 can be proximate to the core segment 122 to define a minimum distance between the segments 122 and 124; when the inflatable members 1010 are fully inflated, the core segment 124 can be spaced away from the core segment 124 by a maximum distance between the segments 122 and 124; and when the inflatable members 1010 are inflated half way, the inflatable members 1010 can position the core segment 124 at a distance that is approximately half the maximum distance.

By adjusting a distance between the core segment 124 and the core segment 122 using the inflatable members 1010 and the springs 1020, the inductance of the resonant transformer 1000 can be adjusted. The force F1 exerted on the core segment 124 by the spring 1020 and the force F2 exerted on the core segment 124 by the inflatable members can be in tension and can operate to stabilize the core segment 124 (e.g., inhibit undesirable movement of the core segment due to, for example vibrations). Limiting undesirable movement of the core segment 124 during an operation of the transformer 1000 can advantageously allow the transformer to provide a substantially stable, accurate, and precise inductance value.

Exemplary embodiments of the present disclosure advantageously provide a relatively small and light resonant transformer that can be controlled to provide an accurate and stable inductance value. For example, embodiments of the coil arrangement described herein can reduce undesirable electrical discharges to provide a stable resonant transformer that can operate without being enclosed in a housing that is maintained under high pressure or filled with oil as are conventional high voltage resonant transformers. Unlike conventional resonant transformers, which use cellulose and an insulating oil to maintain dielectric stability, the (dielectric) stability provided by embodiments of the coil arrangement, allows the housing of exemplary embodiments of the resonant transformer (when used) to be filled with lighter materials, such as air at low humidity (dry air) or inert gases (e.g., nitrogen) at relatively low pressure (0-5 psig). Additionally, by disposing a portion of the split magnetic core external to the main housing, the main housing can be made smaller than tanks of conventional transformers, which advantageously provide for a further reduction in size and weight as compared to convention resonant transformers. Experimental data indicates that exemplary embodiments of the resonant transformer can have a total weight (including power supply and controls) that is less than approximately thirty-five percent (35%) to approximately sixty-five percent (65%) of the weight of an equivalent conventional resonant transformer. A reduction in size and weight of the resonant transformer can allow exemplary embodiments of the resonant transformer to be housed inside a small van rather than a medium size truck.

When the air gap is set to a minimum value, exemplary embodiments of the resonant transformers described herein can generate an inductance that has a value that significantly higher than conventional resonant transformers; allowing resonance to be achieved with very short cables. For example, due to the dielectric stability of the coil arrangements described herein, the coils of the resonant transformers can include a number of turns to generate a large enough inductance to form a resonant circuit with a load capacitance of ten (10) to twenty (20) nanofarads. Such inductances are typically not achieved at power frequencies of 50 Hz to 60 Hz in commercially available conventional resonant transformers.

Similarly, the air gaps of exemplary embodiments of the resonant transformers of the present disclosure can advantageously be smaller than that in a conventional resonant transformer and can be configured in such a manner that the air gap can be placed either outside or inside the main housing. Because the coil arrangements described herein can generate a suitably large inductance while maintaining dielectric stability, the size of the gaps can be reduced as compared to conventional resonant transformers, while still achieve a wide range of inductances to allow the resonant transformer to be configured to achieve resonance with small load capacitances (e.g., 10 nanofarads) and large load capacitances (e.g., 800 nanofarads). The size of the air gap can be changed step-wise or continuously with the possibility of inserting a non-magnetic spacer between the faces of a split magnetic core and by exerting a compressive force on the inserts, to obtain a reactor inductance falling very close to that required to achieve resonance with the capacitance of the test cable. Final resonance can be achieved by changing a frequency of an input voltage to the resonant transformer between, for example, 50 Hz and 60 Hz.

The advantages over conventional resonant transformers described herein are not exhaustive. These and other advantages will be recognized by one skilled in the art upon consideration of exemplary embodiments of the present disclosure.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other embodiments, functions and advantages are also within the scope of the invention.

The invention claimed is:

1. A transformer comprising:
 a main housing
 a split magnetic core having a first core segment and a second core segment, the first core segment being disposed within the main housing and the second core segment being disposed external to the main housing; and
 at least one coil wrapped around the first core segment, wherein a gap between the first and second core segments is manipulated to adjust an inductance of the split magnetic core,
 wherein the at least one coil has a coil arrangement that includes a grounding coil layer and at least one step-up coil layer, and
 wherein the grounding coil layer is formed by a wire that is wrapped about a core mandrel surrounding a portion of the first core segment in more than one direction.

2. The transformer of claim 1, further comprising an inert gas disposed within the housing, the inert gas being maintained under pressure.

3. The transformer of claim 1, wherein the second core segment is exposed to atmospheric pressure.

4. The transformer of claim 1, wherein the second core segment is moveable with respect to the first core segment.

5. The transformer of claim 4, further comprising an actuator that is operative to move the second core segment with respect to the first.

6. The transformer of claim 4, further comprising a non-magnetic member configured to be disposed between the second core segment and the first core segment to limit a movement of the second core segment towards the first core segment during an operation of the transformer.

7. The transformer of claim 6, wherein the non-magnetic member is an inflatable member.

8. The transformer of claim 4, further comprising a resilient member that urges the second core segment towards the first core segment.

9. The transformer of claim 1, wherein a distance between the second core segment is fixed with respect to the first core segment, the transformer further comprising:
 a magnetic member; and
 an actuator operatively coupled to the magnetic member, the actuator being configured to move the magnetic member with respect to the first and second core segments to position the magnetic member in the gap between the first and second core segments to adjust the inductance of the transformer.

10. The transformer of claim 1, wherein the first core segment has at least one of a U-shaped configuration or a C-shaped configuration, and the second core segment has an I-shaped configuration.

11. The transformer of claim 1, wherein the grounding coil includes a first number of turns in a first direction and a second number of turns in a second direction opposite the first direction.

12. The transformer of claim 11, wherein the first number of turns is equal to the second number of turns.

13. The transformer of claim 1, wherein the at least one step-up coil comprises a course of wire wrapped concentrically about the grounding coil, the course of wire being sandwiched between coaxially extending layers of pressure tape.

14. The transformer of claim 13, wherein a layer of insulating material is disposed concentrically over an outer layer of the pressure tape.

15. The transformer of claim 1, wherein the grounding coil layer is formed by a wire that is wrapped about a core mandrel surrounding a portion of the first core segment in more than one direction.

16. The transformer of claim 15, wherein the grounding coil includes a first number of turns in a first direction and a second number of turns in a second direction opposite the first direction.

17. The transformer of claim 16, wherein the first number of turns is equal to the second number of turns.

18. The transformer of claim 13, wherein a layer of insulating material is disposed concentrically over an outer layer of the pressure tape.

19. A transformer comprising:
   a main housing
   a split magnetic core having a first core segment and a second core segment, the first core segment being disposed within the main housing and the second core segment being disposed external to the main housing; and
   at least one coil wrapped around the first core segment,
   wherein a gap between the first and second core segments is manipulated to adjust an inductance of the split magnetic core,
   wherein the at least one coil has a coil arrangement that includes a grounding coil layer and at least one step-up coil layer, and
   wherein the at least one step-up coil comprises a course of wire wrapped concentrically about the grounding coil, the course of wire being sandwiched between coaxially extending layers of pressure tape.

20. The transformer of claim 19, further comprising an inert gas disposed within the housing, the inert gas being maintained under pressure.

21. The transformer of claim 19, wherein the second core segment is exposed to atmospheric pressure.

22. The transformer of claim 19, wherein the second core segment is moveable with respect to the first core segment.

23. The transformer of claim 22, further comprising an actuator that is operative to move the second core segment with respect to the first.

24. The transformer of claim 22, further comprising a non-magnetic member configured to be disposed between the second core segment and the first core segment to limit a movement of the second core segment towards the first core segment during an operation of the transformer.

25. The transformer of claim 24, wherein the non-magnetic member is an inflatable member.

26. The transformer of claim 22, further comprising a resilient member that urges the second core segment towards the first core segment.

27. The transformer of claim 19, wherein a distance between the second core segment is fixed with respect to the first core segment, the transformer further comprising:
   a magnetic member; and
   an actuator operatively coupled to the magnetic member, the actuator being configured to move the magnetic member with respect to the first and second core segments to position the magnetic member in the gap between the first and second core segments to adjust the inductance of the transformer.

28. The transformer of claim 19, wherein the first core segment has at least one of a U-shaped configuration or a C-shaped configuration, and the second core segment has an I-shaped configuration.

\* \* \* \* \*